United States Patent [19]
Ito et al.

[11] Patent Number: 5,812,079
[45] Date of Patent: Sep. 22, 1998

[54] SUBRANGING TYPE A/D CONVERTER APPARATUS EQUIPPED WITH FEEDBACK LINE FOR TRANSMITTING CONTROL SIGNAL FOR A/D CONVERSION

[75] Inventors: Masao Ito; Takashi Okuda, both of Tokyo, Japan

[73] Assignee: Mitsubishi Denki Kabushiki Kaisha, Tokyo, Japan

[21] Appl. No.: 739,017

[22] Filed: Oct. 28, 1996

[30] Foreign Application Priority Data

May 7, 1996 [JP] Japan .................................. 8-112662

[51] Int. Cl.⁶ .................................................. H03M 1/34
[52] U.S. Cl. ............................................. 341/163; 341/156
[58] Field of Search .................................. 341/156, 163; 327/57, 89, 96

[56] References Cited

U.S. PATENT DOCUMENTS

| | | | |
|---|---|---|---|
| 3,870,966 | 3/1975 | Dingwall ................................ | 330/30 D |
| 4,894,656 | 1/1990 | Hwang et al. ........................... | 341/120 |
| 5,070,332 | 12/1991 | Kaller et al. ............................ | 341/156 |
| 5,099,240 | 3/1992 | Nakatani et al. ....................... | 341/156 |
| 5,223,836 | 6/1993 | Komatsu ................................ | 341/156 |
| 5,471,210 | 11/1995 | Wingender et al. .................... | 341/156 |
| 5,581,255 | 12/1996 | Hsu ........................................ | 341/156 |

FOREIGN PATENT DOCUMENTS 1-233750  9/1989  Japan .

OTHER PUBLICATIONS

Masao Ito, Takahiro Miki, Shiro Hosotani, Toshio Kumamoto, Yukihiro Yamashita, Masaki Kijima and Keisuke Okada—"A 10b 20Ms/s 3V–Supply CMOS A/D Converter for Integration into System VLSLs"—International Solid-State Circuits Conference, San Franscisco, California, Feb. 16, 1994. *English Abstract only.

*Primary Examiner*—Marc S. Hoff
*Assistant Examiner*—Jason L. W. Kost

[57] ABSTRACT

In a subranging type A/D converter apparatus, the A/D converter apparatus executes A/D conversion by separating the A/D conversion into an A/D conversion of high-order bits and an A/D conversion of low-order bits in two steps, while feeding back a first control signal for executing the A/D conversion of the low-order bits according to results of the A/D conversion of the high-order bits. A digital logic circuit section executes decision of the A/D conversion to a control terminal of a switch group of a reference voltage generator circuit for generating a plurality of reference voltages via a feedback line provided in a plurality of voltage comparators provided with a plurality of differential amplifiers. Each of the differential amplifiers includes a plurality of transistors each for executing differential amplification. The plurality of differential amplifier transistors are arranged so as to be symmetrical with respect to the feedback line provided in each of the differential amplifiers.

21 Claims, 11 Drawing Sheets

First Preferred Embodiment

Differential Amplifier AMP1a, AMP2a

First Preferred Embodiment

Second Preferred Embodiment

Fig.3 Third Preferred Embodiment

Prior Art and Preferred Embodiments

Modified Preferred Embodiment
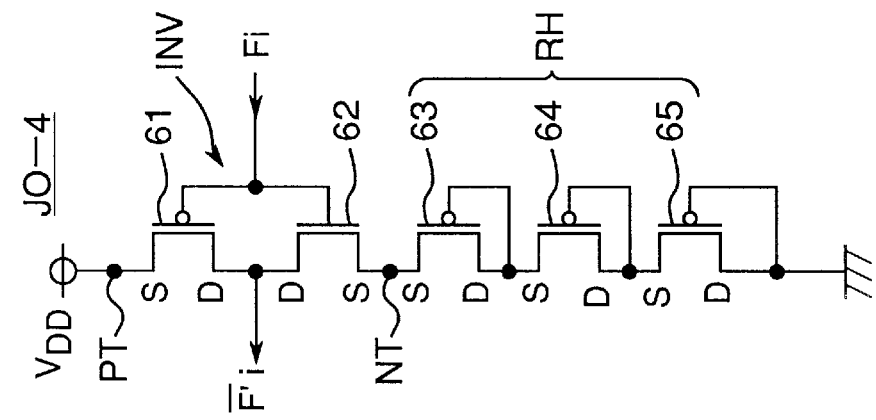
Fig.5D
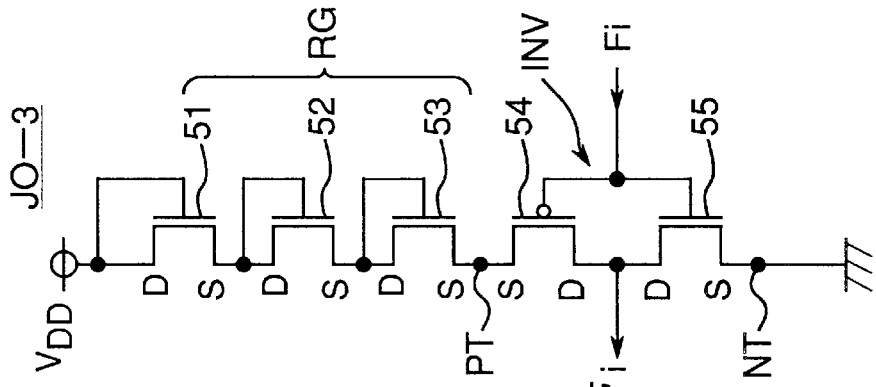
Fig.5C
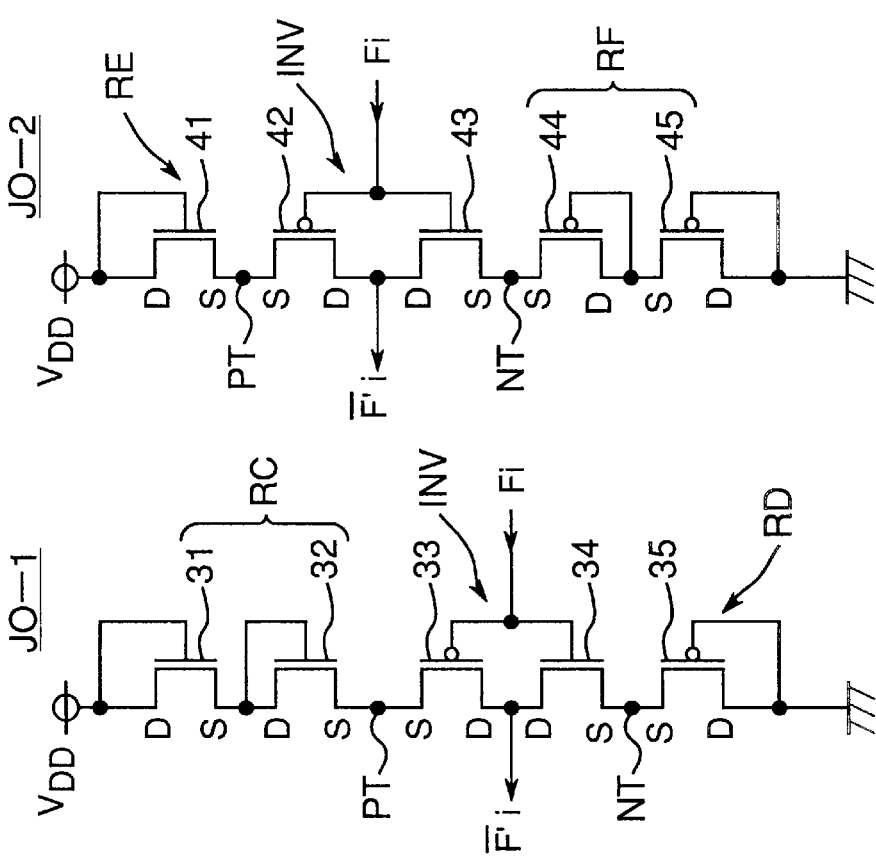
Fig.5B
Fig.5A A/D Converter Differential Amplifier AMP1, AMP2

Differential Amplifier AMP1, AMP2

Inverter Circuit

Inverter Circuit JO of Second Preferred Embodiment (Fig. 2)

SUBRANGING TYPE A/D CONVERTER APPARATUS EQUIPPED WITH FEEDBACK LINE FOR TRANSMITTING CONTROL SIGNAL FOR A/D CONVERSION

BACKGROUND OF THE INVENTION

1. Field of the Invention

The present invention relates to a subranging type or high-order bit and low-order bit separating type analog-to-digital converter apparatus (referred to as an A/D converter apparatus hereinafter) for executing an analog-to-digital conversion (referred to as an A/D conversion hereinafter) by separating the A/D conversion into an A/D conversion of high-order bits (or more significant bits) and an A/D conversion of low-order bits (or less significant bits) in two steps, and in particular, a subranging type A/D converter apparatus equipped with means for transmitting a control signal to be fed back from a digital logic circuit section to an analog circuit section to execute the A/D conversion of the low-order bits according to the results of the A/D conversion of the high-order bits.

2. Description of the Prior Art

Among converters for converting an analog signal into a digital signal (each of the converters is referred to as an A/D converter hereinafter), a subranging type A/D converter apparatus is to execute an A/D conversion by separating the A/D conversion into an A/D conversion of high-order bits and an A/D conversion of low-order bits. Generally speaking, in this type of A/D converter apparatus, conversion of the low-order bits is executed according to the results of the A/D conversion of the high-order bits, it is necessary to provide a feedback line $L_i$ (See FIGS. 7 through 9) for transmitting a control signal, from a digital logic circuit section which outputs the A/D conversion results, to an analog circuit section which executes the A/D conversion.

FIG. 7 is a circuit diagram showing a prior art subranging type A/D converter apparatus having a resolution of 10 bits. A reference voltage generator circuit VREF shown in FIG. 7 includes 32 resistors R1 through R32 connected in series with each other. The reference voltage generator circuit VREF generates reference voltages Vrf1-1 through Vrf1-31, ..., Vrfi-1 through Vrfi-31, Vrf32-1 through Vrf32-31 (denoted generically by Vrf hereinafter) obtained by equally dividing a voltage difference between a voltage $V_{RT}$ of a voltage source of, for example, 1 V and a voltage $V_{RB}$ of, for example, a ground potential into $2^{10}$ or 1024 voltage levels. The reference voltage generator circuit VREF further generates a high-order comparison reference voltage $Vrc_{i-1}$ (denoted generically by Vrc hereinafter) at a terminal on the voltage $V_{RB}$ side of each resistor $R_i$ and then outputs the reference voltage to a voltage comparator $CMP_i$.

Each voltage comparator $CMP_i$ (i=1, 2, ..., 31) compares a voltage level Vin of an analog input signal with a voltage level of a reference voltage Vrf generated by the reference voltage generator circuit VREF. When $$Vin \geq Vrf \qquad \ldots (1),$$

the voltage comparator $CMP_i$ outputs a High level (referred to as an H level hereinafter) comparison result signal $S_i$ to a decision circuit JDG. On the other hand, when $$Vin < Vrf \qquad \ldots (2),$$

the voltage comparator $CMP_i$ outputs a low level (referred to as an L level hereinafter) comparison result signal Si to the decision circuit JDG.

The decision circuit JDG is a digital logic circuit section for executing decision of A/D conversion. As shown in FIG. 4, the decision circuit JDG generates a control signal $J_j$ (j=1, 2, ..., 32) according to the comparison result signal $S_i$ (i=1, 2, ..., 31) of the voltage comparator $CMP_i$ at a trailing edge of a timing signal $\phi FB$, and then, outputs the signal to an encoder ENC and a feedback signal generator circuit FB. In this case, with regard to the comparison result signal $S_i$, only the control signal $J_j$ (i=j) corresponding to the comparison result signal $S_i$ which comes to have the H level firstly when i is changed from 31 toward 1 is made to have the L level, whereas the control signal $J_j$ is made to have the H level in the other cases. The control signal $J_j$ (j=1, 2, ..., 32) is transmitted to the encoder ENC, and the encoder ENC outputs a 5-bit digital code data in response to this.

On the other hand, the feedback signal generator circuit FB executes a timing adjusting process based on the timing signal $\phi FB$ onto the control signal $J_j$, i.e., the feedback signal generator circuit FB converts the control signal $J_j$ into an output signal $F_j$ (j=1, 2, ..., 32) having the same level as that of the control signal $J_j$ at a leading edge of the timing signal $\phi FB$ as shown in FIG. 4, and then, outputs the resulting signal as a switching control signal to switch groups $SW_j$ (j=1, 2, ..., 32) via a feedback line $L_j$, wherein each of the switch groups $SW_j$ (j=1, 2, ..., 32) comprises 31 switches. This output signal $F_j$ is used for selecting the reference voltage Vrf to be applied from the reference voltage generator circuit VREF to the voltage comparator $CMP_i$ via the switch group $SW_j$ (j=1, 2, ..., 32).

An operation of the prior art A/D converter apparatus will be described below with reference to a timing chart of FIG. 4 which shows the operation of the A/D converter apparatus. Referring to FIG. 4, an automatic-zero operation for setting the gains of differential amplifiers AMP1 and AMP2 as shown in FIG. 8 to the maximum is executed in each voltage comparator $CMP_i$ (i=1, 2, ..., 31) in an automatic-zero interval or automatic calibration interval AZ to effect sampling of an analog input voltage Vin. Then, in a comparison interval CC, each voltage comparator $CMP_i$ (i=1, 2, ..., 31) executes a comparison between a high-order reference voltage $Vrc_i$ (i=1, 2, ..., 31) generated by the reference voltage generator circuit VREF and the analog input voltage Vin, wherein this comparison is referred to as a high-order comparison hereinafter). The decision circuit JDG generates the control signal $J_j$ (j=1, 2, ..., 32) based on the output results of the high-order comparison from the voltage comparator $CMP_i$ (i=1, 2, ..., 31), and then, outputs the signal.

In the present case, when, for example, the analog input voltage Vin is $$Vrc_{k-1} < Vin < Vrc_k \qquad \ldots (3),$$

a comparison result signal $S_m$ outputted from a voltage comparator $CMP_m$ (m=1, 2, ..., k-1) comes to have the H level, while a comparison result signal $S_n$ outputted from the other voltage comparator $CMP_n$ (n=k, k+1, ..., 31) comes to have the L level. According to the comparison result signals $S_m$ and $S_n$, the decision circuit JDG changes the level of only a control signal $J_k$ from the H level to the L level, and the other signals are all kept at the H level. The control signal $J_k$ is transmitted to the encoder ENC, and the control signal $J_k$ is used for generating a digital code of the most significant five bits. At the same time, the control signal $J_k$ is simultaneously converted into a signal $F_k$ by the timing adjustment performed by the feedback signal generator circuit FB, and thereafter, the signal $F_k$ is transmitted to the switch group $SW_k$ via the feedback line $L_k$.

Then, in a comparison interval FC, all the 31 switches of the switch group $SW_k$ are turned on in accordance with the control signal $F_k$ that has come to have the L level, and a low-order comparison reference voltage $Vrf_{k-i}$ (i=1, 2, ..., 31) corresponding to a voltage range between the high-order comparison reference voltages $Vrc_{k-1}$ and $Vrc_k$ is applied to the voltage comparator $CMP_i$ (i=1, 2, ..., 31), so that each voltage comparator $CMP_i$ executes a comparison between the analog input voltage Vin and the low-order comparison reference voltage $Vrf_{k-i}$ (the comparison referred to as a low-order comparison hereinafter). Further, the decision circuit JDG generates the control signal $J_j$ based on the results of the low-order comparison, and the control signal $J_j$ is transmitted to the encoder ENC, in which the control signal $J_j$ is used for generating a digital code data of the less significant five bits.

FIG. 8 is a circuit diagram of the prior art voltage comparator $CMP_i$ (i=1, 2, ..., 31) comprising the feedback line $L_i$ (i=1, 2, ..., 31) and $L_{32}$.

Referring to FIG. 8, the voltage comparator $CMP_i$ (i=1, 2, ..., 31) is provided with differential amplifiers AMP1 and AMP2 having the same construction as those shown in FIGS. 9 and 10, an output differential amplifier AMP3, an inverter INV11, a latch circuit LT11, a plurality of coupling capacitors Cc, and switches Sc1, Sc2 and Sc3 which are controlled to be turned on and off in accordance with control signals $\phi1$, $\phi2$ and $\phi3$, respectively. Further, FIG. 9 is a plan view showing a layout of each of the differential amplifiers AMP1 and AMP2 and feedback line $L_i$ of the prior art, while FIG. 10 is a circuit diagram thereof.

Referring to FIGS. 8 and 9, Cf denotes a stray capacitance or a parasitic capacitance between wiring lines, and AL denotes an active region of a semiconductor substrate 10 on which MOS field effect transistors 10 and 13 through 16 are formed as shown in FIG. 9. Further, in FIGS. 9 and 10, each of the reference numerals 10, 13 and 14 denotes an n-channel MOS field effect transistor (referred to as an NMOS field effect transistor hereinafter), while each of the reference numerals 15 and 16 denotes a p-channel MOS field effect transistor (referred to as a PMOS field effect transistor hereinafter). Referring to the plan view of FIG. 9, each of the MOS field effect transistors 10 and 13 through 16 are formed by interposing a gate electrode G between a source electrode S and a drain electrode D, where the PMOS field effect transistors 15 and 16 are expressed as the PMOS field effect transistors by hatching their gate electrodes G, and the source electrodes S of the MOS field effect transistors 10, 13, 14, 15 and 16 are expressed as the source electrodes S by being hatched.

Problems to be solved by the present invention will be described below. As shown in FIGS. 8 and 9, in the prior art subranging type A/D converter apparatus, the feedback line $L_i$ (i=1, 2, ..., 31) is wired to the switch group $SW_i$ (i=1, 2, ..., 31) so as to be extended along the periphery of the differential amplifier AMP1 of the voltage comparator $CMP_i$ (i=1, 2, ..., 31) in terms of layout. For example, in the subranging type A/D converter apparatus having a resolution of 10 bits, it is required to execute a comparison in magnitude of a potential difference on the level of $½^{10}$ (=$⅟_{1024}$) V (volt) in the voltage comparator $CMP_i$ (i=1, 2, ..., 31). When a voltage fluctuation of several volts from the H level to the L level occurs in the feedback line $L_i$ (i=1, 2, ..., 31) arranged in the vicinity of input and output lines La of each of the differential amplifiers AMP1 and AMP2 of the voltage comparator $CMP_i$ (i=1, 2, ..., 31) that executes the comparison of such a small voltage difference, the component of the voltage fluctuation is transmitted to the input and output lines La via the parasitic capacitances Cf. This leads to such a problem that the voltages at the lines deviate from their normal voltage levels, and this results in deterioration of the accuracy of the voltage comparator $CMP_i$ (i=1, 2, ..., 31).

There is another problem that, the control signal $F_j$ (j=1, 2, ..., 31) transmitted through the feedback line $L_i$ (i=1, 2, ..., 31) extended along the periphery of the voltage comparator $CMP_i$ (i=1, 2, ..., 31) for executing the comparison of the smallest voltage difference in the high-order comparison process changes from the H level to the L level according to the high-order comparison result, and therefore, the voltage fluctuation at the feedback line exerts a great influence on the voltage comparator, this causes a great deterioration of the accuracy.

The above-mentioned problem will be described in more detail with reference to the circuit diagram of FIG. 7 and the timing chart of FIG. 4. In a high-order comparison interval CC, the 31 voltage comparators $CMP_i$ (i=1, 2, ..., 31) execute the high-order comparison process, and the decision circuit JDG generates and outputs the control signal $F_j$ (j=1, 2, ..., 32) based on the comparison result signal $S_i$ outputted from the comparators. For example, when the analog input voltage Vin is $$Vin \approx Vrc_k \qquad \ldots (4)$$

and $$Vrc_{k-1} < Vin \leq Vrc_k \qquad \ldots (5),$$

i.e., when the analog input voltage Vin is smaller than the high-order comparison reference voltage $Vrc_k$ by a small difference, only the control signal $F_k$ changes its level from the H level to the L level, while all the others are kept at the H level. In this stage, the voltage comparator $CMP_k$ compares the small voltage difference between the analog input voltage Vin and the high-order comparison reference voltage $Vrc_k$.

Referring to the timing chart of FIG. 4, the control signal $J_j$ (j=1, 2, ..., 32) is generated based on the comparison result signal $S_i$ outputted from the voltage comparator $CMP_i$ (i=1, 2, ..., 31) by the decision circuit JDG, while the voltage comparator $CMP_k$ executes the high-order comparison process, and the control signal $J_k$ among them changes its level from the H level to the L level. Then, the control signal $F_k$, the timing of which has been adjusted by the feedback signal generator circuit FB, also changes its level from the H level to the L level, and the control signal $F_k$ is transmitted to the switch group $SW_k$ via the feedback line $L_k$. In the above-mentioned case, since the voltage comparator $CMP_k$ executes the comparison of the small voltage difference, an output signal from the voltage comparator $CMP_k$ will possibly be unstable due to the influence of noises and the like.

That is, when it is decided that $$Vin < Vrc_k \qquad \ldots (6),$$

the output signal from the voltage comparator $CMP_k$ become an L-level comparison result signal $S_i$. However, for example, when a noise or the like is induced at the wiring provided in the voltage comparator $CMP_k$ via the parasitic capacitances Cf between wiring lines, and then, when it is decided that $$Vin > Vrc_k \qquad \ldots (7),$$

the output signal from the voltage comparator $CMP_k$ can become an H-level comparison result signal $S_i$. Thus, when the output signal from the voltage comparator $CMP_k$ changes its level from the L level to the H level or from the H level to the L level, the control signal $J_k$ outputted from the decision circuit JDG changes its level from the L level to the H level or from the H level to the L level in accordance therewith. By this operation, the control signal $F_k$ of the feedback signal generator circuit FB changes from the L level to the H level or from the H level to the L level. As a result, the differential comparison operation of the voltage comparator $CMP_k$ becomes less stable due to the change of the voltage level at the feedback line $L_k$, consequently this results in deterioration of the accuracy. Furthermore, since the parasitic capacitances Cf of the feedback line $L_i$ to respective input and output lines change, the operational balance of the differential amplifier would be disordered to possibly cause an error in the output signal thereof. Due to the deterioration of the operational accuracy of the voltage comparator as described above, and then, the performance of the entire A/D converter apparatus deteriorates.

SUMMARY OF THE INVENTION

An essential object of the present invention is therefore to provide a subranging type A/D converter apparatus capable of improving its A/D conversion performance by reducing the influence of the voltage fluctuation at each feedback line $L_i$ (i=1, 2, ..., 31) for transmitting each control signal $F_i$ for executing switching control of each switch group $SW_i$ on the input and output lines and the transistor elements of differential amplifiers AMP1 and AMP2, thereby suppressing the possible deterioration of the operational accuracy of each of the differential amplifiers AMP1 and AMP2.

In order to achieve the above-mentioned objective, according to one aspect of the present invention, there is provided a subranging type analog-to-digital converter apparatus for executing analog-to-digital conversion by separating the analog-to-digital conversion into an analog-to-digital conversion of high-order bits and an analog-to-digital conversion of low-order bits in two steps, while feeding back a first control signal for executing the analog-to-digital conversion of the low-order bits according to results of the analog-to-digital conversion of the high-order bits, from a digital logic circuit section for executing decision of the analog-to-digital conversion to a control terminal of a switch group of a reference voltage generator circuit for generating a plurality of reference voltages via a feedback line provided in a plurality of voltage comparators provided with a plurality of differential amplifiers, wherein each of said differential amplifiers comprises a plurality of transistors each for executing differential amplification, and wherein said plurality of transistors are arranged so as to be symmetrical with respect to said feedback line provided in each of said differential amplifiers.

In the above-mentioned analog-to-digital converter apparatus, a pair of input signal lines of each of said differential amplifiers is arranged so as to be symmetrical to each other with respect to said feedback line, and wherein a pair of output signal lines of each of said differential amplifiers is arranged so as to be symmetrical to each other with respect to said feedback line.

In the above-mentioned analog-to-digital converter apparatus, the first control signal generated by said digital logic circuit section has a predetermined first voltage amplitude for a full swing of the first control signal, wherein said analog-to-digital converter apparatus further comprises:

a first inverter circuit for converting the first control signal generated by said digital logic circuit section into a second control signal having a predetermined second voltage amplitude smaller than said first voltage amplitude for a full swing of the second control signal, inverting the second control signal, and generating and outputting an inverted control signal via said feedback line; and a second inverter circuit for converting the inverted control signal outputted from said first inverter circuit via the feedback line into a third control signal having said first voltage amplitude for a full swing of the third control signal, inverting the third control signal, and generating and outputting a fourth control signal to the control terminal of the switch group of said reference voltage generator circuit.

In the above-mentioned analog-to-digital converter apparatus, said first inverter circuit converts the first control signal generated by said digital logic circuit section into a fifth control signal having a predetermined third voltage amplitude smaller than said second voltage amplitude for a full swing of the fifth control signal, and having a center voltage of said third voltage amplitude different from a center voltage of said first voltage amplitude, inverting the fifth control signal, and generating and outputting an inverted control signal via said feedback line, wherein said analog-to-digital converter apparatus further comprises:

a pre-charge voltage generator circuit for previously charging said feedback line to a predetermined pre-charge voltage close to a center voltage of signal change of said inverted control signal, in response to a first timing signal;

a coupling capacitor, capacitively coupled with the inverted control signal outputted from said feedback line, for outputting an alternating current component of said inverted control signal to said second inverter circuit;

first switch means for short-circuiting an input terminal of said second inverter circuit with an output terminal of said second inverter circuit to each other, and keep the signal level of the inverted control signal inputted to said second inverter circuit, in response to said first timing signal;

second switch means for outputting the inverted control signal outputted from said first inverter circuit to said feedback line, in response to a second timing signal; and third switch means for outputting the control signal outputted from said second inverter circuit to the control terminal of the switch group of said reference voltage generator circuit, in response to said second timing signal, and wherein said inverted control signal transmitted via said feedback line has said third voltage amplitude having a center voltage of said pre-charge voltage and changing according to the control signal outputted from said digital logic circuit section.

In the above-mentioned analog-to-digital converter apparatus, said pre-charge voltage generator circuit comprises:

a fourth inverter circuit, having an input terminal and an output terminal short-circuited, for generating and outputting said pre-charge voltage; and fourth switch means for outputting said pre-charge voltage outputted from said fourth inverter circuit to said feedback line, in response to said first timing signal.

In the above-mentioned analog-to-digital converter apparatus, said first inverter circuit comprises:

an inverter having a positive power source terminal and a negative power source terminal, and comprising a PMOS field effect transistor and an NMOS field effect transistor which are operatively connected between the positive power source terminal and the negative power source terminal;

a first resistor element, operatively connected between the positive power source terminal of said inverter and a voltage source, for dropping a voltage of said voltage source by a predetermined first descent voltage, and supplying a resulting dropped voltage to the positive power source terminal of said inverter; and a second resistor element, operatively connected between the negative power source terminal of said inverter and a ground, for dropping a voltage at the negative power source terminal of said inverter by a predetermined second descent voltage different from said first descent voltage relative, to a ground potential.

In the above-mentioned analog-to-digital converter apparatus, said first inverter circuit comprises:

an inverter having a positive power source terminal connected to a voltage source, and a negative power source terminal, and comprising a PMOS field effect transistor and an NMOS field effect transistor which are operatively connected between the positive power source terminal and the negative power source terminal; and a second resistor element, operatively connected between the negative power source terminal of said inverter and a ground, for dropping a voltage at the negative power source terminal of said inverter to a ground potential, by a predetermined second descent voltage that exceeds zero.

In the above-mentioned analog-to-digital converter apparatus, said first inverter circuit comprises:

an inverter having a positive power source terminal and a grounded negative power source terminal, and comprising a PMOS field effect transistor and an NMOS field effect transistor which are operatively connected between the positive power source terminal and the negative power source terminal; and a first resistor element, operatively connected between the positive power source terminal of said inverter and a voltage source, for dropping a voltage of said voltage source by a predetermined first descent voltage, and supplying a resulting dropped voltage to the positive power source terminal of said inverter.

In the above-mentioned analog-to-digital converter apparatus, said first inverter circuit comprises a differential amplifier; and wherein said differential amplifier comprises:

a pair of first and second NMOS field effect transistors each constructed so that a voltage between a source and a drain thereof changes within a voltage amplitude smaller than a voltage amplitude of said first control signal according to said first control signal, in response to the first timing signal; and a pair of switch means, operatively connected respectively between a gate electrode of said first MOS field effect transistor and a drain electrode of said second MOS field effect transistor and between a drain electrode of said first MOS field effect transistor and a gate electrode of said second MOS field effect transistor, for, in response to the second timing signal, making said first and second MOS field effect transistors latch the voltage between the source and the drain of said first MOS field effect transistor, and the voltage between the source and the drain of said second MOS field effect transistor, respectively, each voltage changing according to said control signal, and outputting an inverted control signal obtained by inverting said first control signal and having a voltage amplitude smaller than the voltage amplitude of said first control signal.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which:

FIGS. 5A, 5B, 5C and 5D are circuit diagrams showing modified preferred embodiments of an inverter circuit JO as shown in FIGS. 2 and 3, where FIG. 5A shows a first example JO-1 of the inverter circuit, FIG. 5B shows a second example JO-2 of the inverter circuit, FIG. 5C shows a third example JO-3 of the inverter circuit and FIG. 5D shows a fourth example JO-4 of the inverter circuit;

DETAILED DESCRIPTION OF THE PREFERRED EMBODIMENTS

Preferred embodiments according to the present invention will be described below with reference to the accompanying drawings.

First Preferred Embodiment

Figure 1:
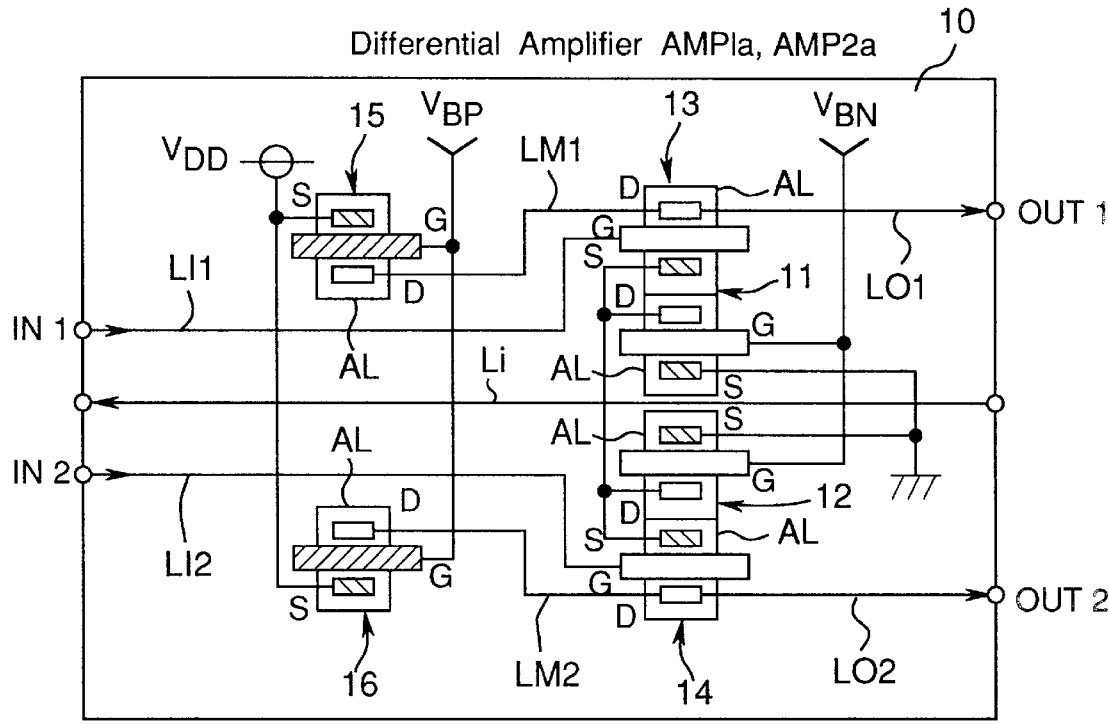
FIG. 1 is a plan view showing a layout of each of differential amplifiers of a subranging type A/D converter apparatus of a first preferred embodiment according to the present invention.

FIG. 1 is a plan view of first preferred embodiment of the present invention, showing a layout of each of differential amplifiers AMP1a and AMP2a provided in place of the prior art differential amplifiers AMP1 and AMP2, where the differential amplifiers AMP1a and AMP2a have same construction and configuration. The first preferred embodiment shown in FIG. 1 is characterized in that the current source NMOS field effect transistor 10 of the prior art is formed so as to be divided into two NMOS field effect transistors 11 and 12 for current source, and in regard to the layout of each of the differential amplifiers AMP1a and AMP2a, the MOS field effect transistors 11 through 16 are arranged so as to be symmetrical with respect to a feedback line $L_i$ in comparison with the prior art shown in FIG. 9.

Referring to FIG. 1, the PMOS field effect transistors 15 and 16 for voltage source are arranged so as to be symmetrical to each other with respect to the feedback line $L_i$, while a pair of NMOS field effect transistors 11 and 13 and a pair of NMOS field effect transistors 12 and 14 are formed in positions symmetrical to each other. In the present case, the MOS field effect transistors 11, 13 and 15 are formed on the semiconductor substrate 10 at the upper side of the feedback line $L_i$ in FIG. 1, while the MOS field effect transistors 12, 14 and 16 are formed on the semiconductor substrate 10 at the lower side of the feedback line $L_i$ in FIG. 1. In this case, the NMOS field effect transistors 11 and 12 are formed in inner positions closer to the feedback line $L_i$ with respect to the NMOS field effect transistors 13 and 14. It is to be noted that the NMOS field effect transistors 13 and 14 are provided for detecting the input signal.

On the other hand, a first input signal line LI1 connected to a first input terminal IN1 is formed so as to be connected to the gate electrode G of the NMOS field effect transistor 13 through a space between the feedback line $L_i$ and the PMOS field effect transistor 15, while a second input signal line LI2 connected to a second input terminal IN2 is formed so as to be connected to the gate electrode G of the NMOS field effect transistor 14 through a space between the feedback line $L_i$ and the PMOS field effect transistor 16. On the other hand, (i) a first output signal line LO1 for connecting the drain electrode D of the NMOS field effect transistor 13 to a first output terminal OUT1 and (ii) a second output signal line LO2 for connecting the drain electrode D of the NMOS field effect transistor 12 to a second output terminal OUT2 are formed in positions symmetrical to each other with respect to the feedback line $L_i$.

Further, a voltage source $V_{DD}$ having a voltage of, for example, +5 V is connected to the source electrodes S of the PMOS field effect transistors 15 and 16, while a voltage source $V_{BP}$ having a voltage of, for example, +2.1 V is connected to the gate electrodes G of the PMOS field effect transistors 15 and 16. The drain electrode D of the PMOS field effect transistor 15 is connected to the drain electrode D of the NMOS field effect transistor 13, while the drain electrode D of the PMOS field effect transistor 16 is connected to the drain electrode D of the NMOS field effect transistor 14. In the present case, a first interconnection line LM1 for connecting the drain electrode D of the PMOS field effect transistor 15 to the drain electrode D of the NMOS field effect transistor 13 and a second interconnection line LM2 for connecting the drain electrode D of the PMOS field effect transistor 16 to the drain electrode D of the NMOS field effect transistor 14 are formed in positions symmetrical to each other with respect to the feedback line $L_i$.

A voltage source $V_{BN}$ having a voltage of, for example, +1.2 V is connected to the gate electrodes G of the NMOS field effect transistors 11 and 12. Further, the drain electrode D of the NMOS field effect transistor 11, the source electrode S of the NMOS field effect transistor 13, the drain electrode D of the NMOS field effect transistor 12, and the source electrode S of the NMOS field effect transistor 14 are connected to each other together. Both of the source electrodes S of the NMOS field effect transistors 11 and 12 are grounded.

Figure 9:
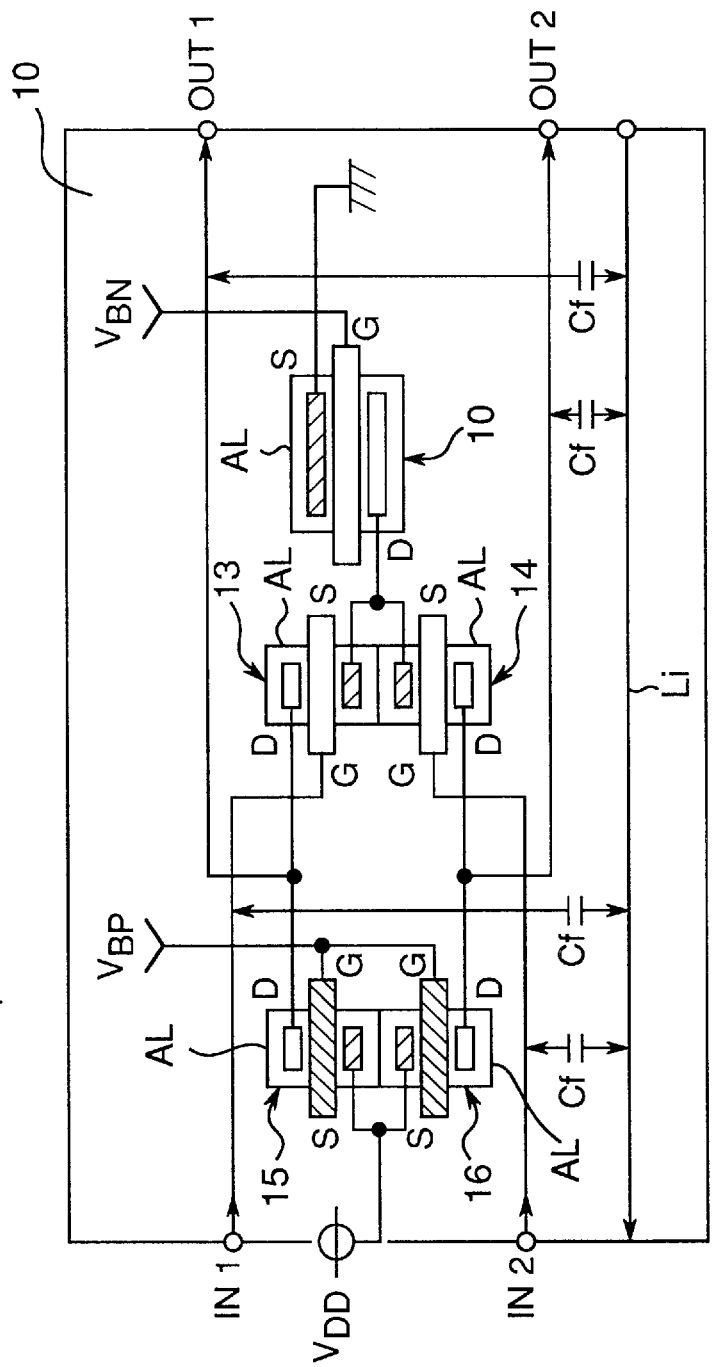
FIG. 9 is a plan view showing a layout of each of differential amplifiers AMP1 and AMP2 in a voltage comparator $CMP_i$ as shown in FIG. 8.
Figure 10:
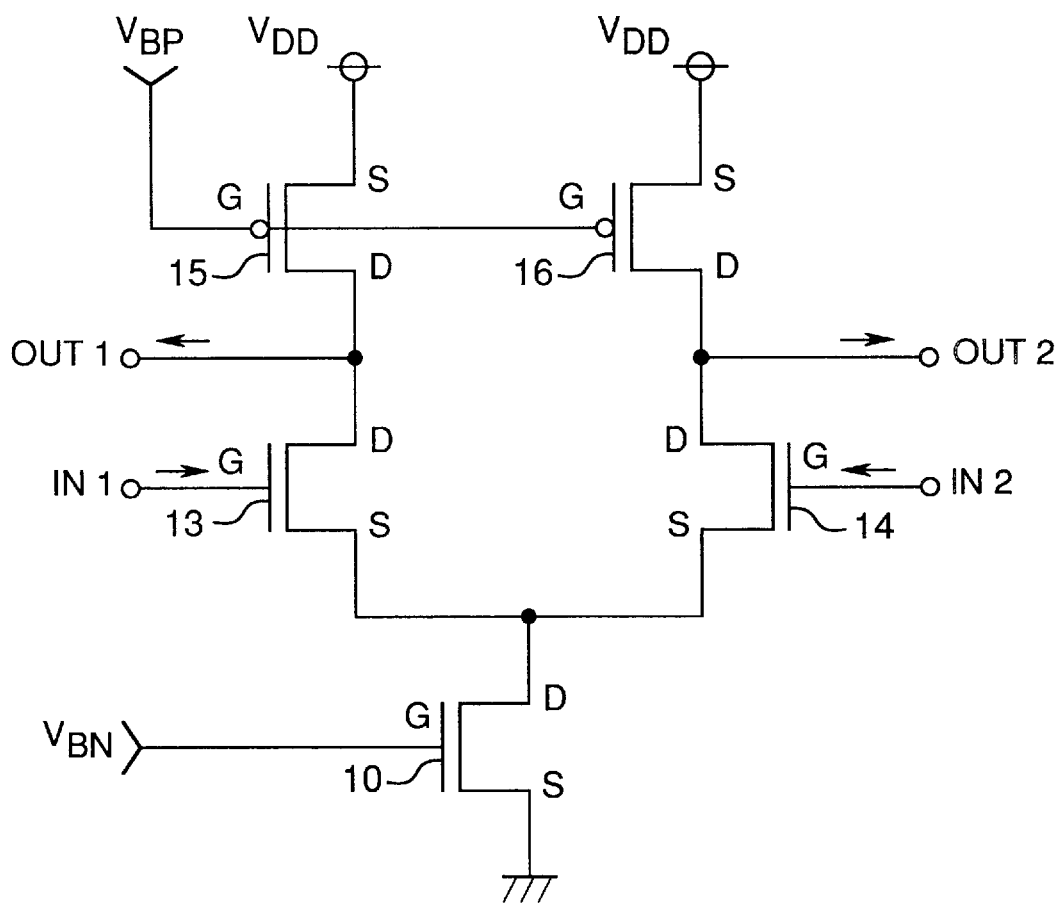
FIG. 10 is a circuit diagram showing circuits of each of the differential amplifiers AMP1 and AMP2 shown in FIG. 9.

As described above, in the first preferred embodiment, the differential amplifiers AMP1a and AMP2a are characterized by the layout arrangement of the transistors 11 through 16, where the NMOS field effect transistors 11 and 12, the NMOS field effect transistors 13 and 14 and the PMOS field effect transistor 15 and 16 are arranged so as to be symmetrical to each other with respect to the feedback line $L_i$, respectively. As shown in FIG. 9, in the prior art, only one NMOS field effect transistor 10 is used as the transistor of each of the differential amplifiers AMP1 and AMP2 for current source. In contrast to the above, in each of the differential amplifiers AMP1a and AMP2a of the first preferred embodiment, one NMOS field effect transistor 10 is arranged so as to be divided into the two NMOS field effect transistors 11 and 12 in order to assure the symmetry of them with respect to the feedback line $L_i$. With this arrangement, a voltage fluctuation at the feedback line $L_i$ exerts its influence equally on the two input signal lines LI1 and LI2 and the MOS field effect transistors 11 through 16 of each of the differential amplifiers AMP1a and AMP2a via the parasitic capacitances Cf between the lines of the prior art shown in FIG. 9. Therefore, an operational balance is assured in each of the differential amplifiers AMP1a and AMP2a, thereby cancelling the possible error in the output signal. In other words, the influence of the above-mentioned noises and the like can be canceled by each of the differential amplifiers AMP1a and AMP2a each for comparing the voltage difference between the two inputs, thereby suppressing the deterioration of the operational accuracy of the voltage comparator $CMP_i$.

Second Preferred Embodiment

Figure 2:
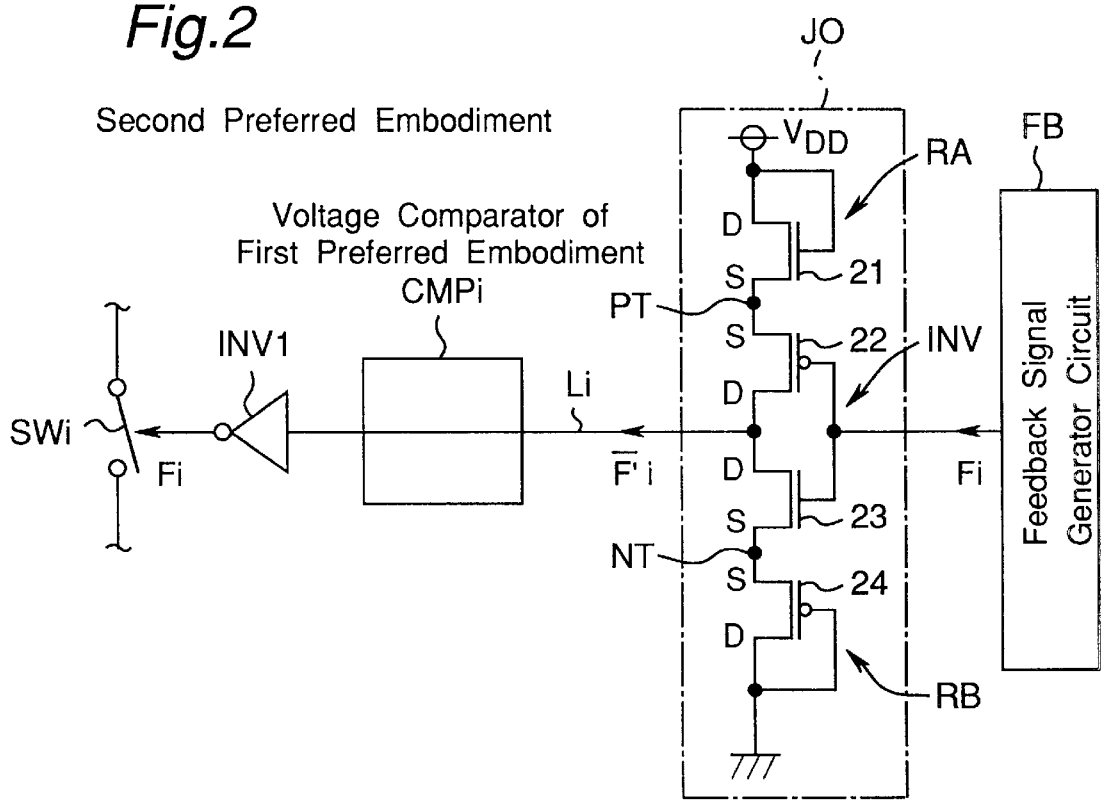
FIG. 2 is a circuit diagram showing a circuit extending from a feedback signal generator circuit to a switch group $SW_i$ in a subranging type A/D converter apparatus of a second preferred embodiment according to the present invention.

FIG. 2 is a circuit diagram showing a circuit extending from a feedback signal generator circuit FB to a switch group $SW_i$ in a subranging type A/D converter apparatus of a second preferred embodiment according to the present invention. The second preferred embodiment is characterized in that the amplitude of the voltage change of the control signal $F_j$ is made to be outputted so as to be reduced in the output circuit of the decision circuit JDG.

The output signal $F_i$ outputted from the feedback signal generator circuit FB is applied to the control terminal of the switch group $SW_i$ via an inverter circuit JO, the feedback line $L_i$ of the voltage comparator $CMP_i$ of the first preferred embodiment and an inverter INV1.

In the inverter circuit JO, a voltage source $V_{DD}$ is grounded via the followings:

(a) the drain electrode and the source electrode of an NMOS field effect transistor 21 in which its gate electrode and its drain electrode are connected to each other to operate as a voltage dropping resistor element RA;

(b) the source electrode and the drain electrode of a PMOS field effect transistor 22;

(c) the drain electrode and the source electrode of an NMOS field effect transistor 23; and (d) the source electrode and the drain electrode of a PMOS field effect transistor 24 in which its gate electrode and its drain electrode are connected to each other to operate as a voltage dropping resistor element RB.

Each of the PMOS field effect transistor 22 and the NMOS field effect transistor 23 operates as an inverter which has been known to those skilled in the art, and the output signal $F_i$ from the feedback signal generator circuit FB is applied to the gate electrodes of the PMOS field effect transistor 22 and the NMOS field effect transistor 23. On the other hand, an inverted inverter output signal $\overline{F}_i$ is outputted from the respective drain electrodes of the PMOS field effect transistor 22 and the NMOS field effect transistor 23. In the present case, each of the voltage dropping resistor elements RA and RB drop its respective voltages between both ends thereof by a voltage of $(\frac{1}{2})V_{DD}$. In other words, the resistor element RA is connected between the positive power source terminal PT of the inverter INV and the voltage source $V_{DD}$, and operates to drop the voltage of the voltage source $V_{DD}$ by a predetermined first descent voltage or drop voltage and apply the resulting dropped voltage to the positive power source terminal PT of the inverter INV. The resistor element RB is connected between the negative power source terminal NT of the inverter INV and the ground and operates to drop the voltage at the negative power source terminal NT of the inverter INV by a predetermined second descent voltage or drop voltage different from the first descent voltage or drop voltage, toward the ground potential. It can be also said that the resistor element RB is a sort of voltage build-up element for raising or building up the ground potential by a voltage equal to the second descent voltage or drop voltage to raise or build-up the ground potential to the voltage at the negative power source terminal NT. The operations of the voltage dropping resistor elements, which will be described below are the same as those of the above-mentioned voltage dropping resistor elements RA and RB.

Figure 11:
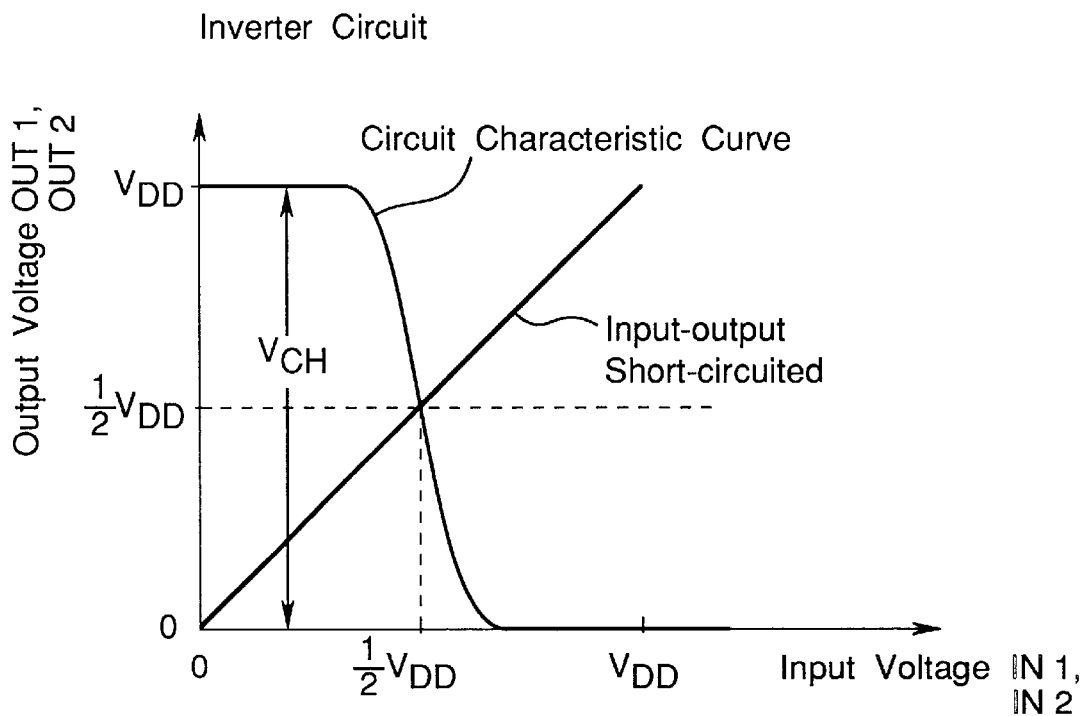
FIG. 11 is a graph showing an input to output voltage characteristic of the prior art inverter circuit.
Figure 12:
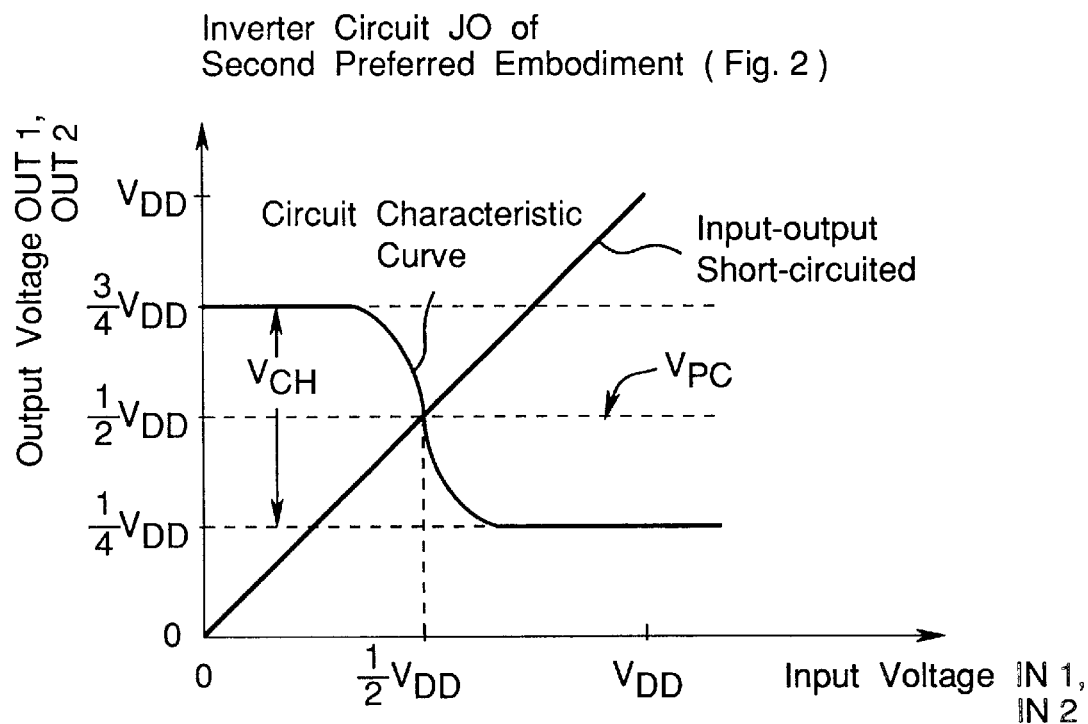
FIG. 12 is a graph showing an input to output voltage characteristic of the inverter circuit JO of the second preferred embodiment shown in FIG. 2.

For example, the publicly known prior art inverter circuit comprised of only the MOS field effect transistors 22 and 23 has an input to output voltage characteristic as shown in FIG. 11, where the output voltage changes from the voltage $V_{DD}$ to zero when the input voltage changes from zero to the voltage $V_{DD}$. That is, the full swing or changing amplitude $V_{CH}$ of the output signal is $V_{DD}$. On the other hand, the inverter circuit JO shown in FIG. 2 has an input to output voltage characteristic as shown in FIG. 12, where the output voltage changes from the voltage $(\frac{3}{4})V_{DD}$ to the voltage $(\frac{1}{4})V_{DD}$ when the input voltage changes from zero to the voltage $V_{DD}$. That is, the full swing or changing amplitude $V_{CH}$ of the inverted output signal $\overline{F}_i$ is $(\frac{1}{2})V_{DD}$, which is smaller than that in the prior art.

Then, the inverted output signal $\overline{F}_i$ from the inverter circuit JO is applied to the inverter INV1 via the voltage comparator $CMP_i$ having the same construction as that of the first preferred embodiment. In response to the inverted output signal $\overline{F}_i$, the inverter INV1, which is the publicly known prior art inverter circuit that is comprised of only the MOS field effect transistors 22 and 23 and has the input to output voltage characteristic shown in FIG. 11, operates to invert and amplify the inputted inverted output signal $\overline{F}_i$ having a full swing or changing amplitude $V_{CH}$ of $(\frac{1}{2})V_{DD}$, so as to convert the output signal $\overline{F}_i$ into a signal $F_i$ having a full swing or changing amplitude $V_{CH}$ of $V_{DD}$ which is equivalent to the output signal from the feedback signal generator circuit FB, and then output the resulting signal $F_i$ to the control terminal of the switch group $SW_i$. Therefore, the inverter INV1 is inserted for the purpose of adjusting the polarity of the output signal F and obtaining the full swing or changing amplitude or the voltage amplitude $V_{CH}$ which is required for switching the switch group SW.

As described above, according to the second preferred embodiment, the voltage fluctuation at the feedback line $L_i$ is reduced to remarkably reduce the influence on a pair of input signal lines LI1 and LI2, a pair of output signal lines LO1 and LO2, and a pair of transistors 11 and 16 of each of the differential amplifiers AMP1$a$ and AMP2$a$ in the voltage comparator $CMP_i$. Therefore, the possible deterioration of the operational accuracy of the voltage comparator $CMP_i$ can be suppressed.

Third Preferred Embodiment

Figure 3:
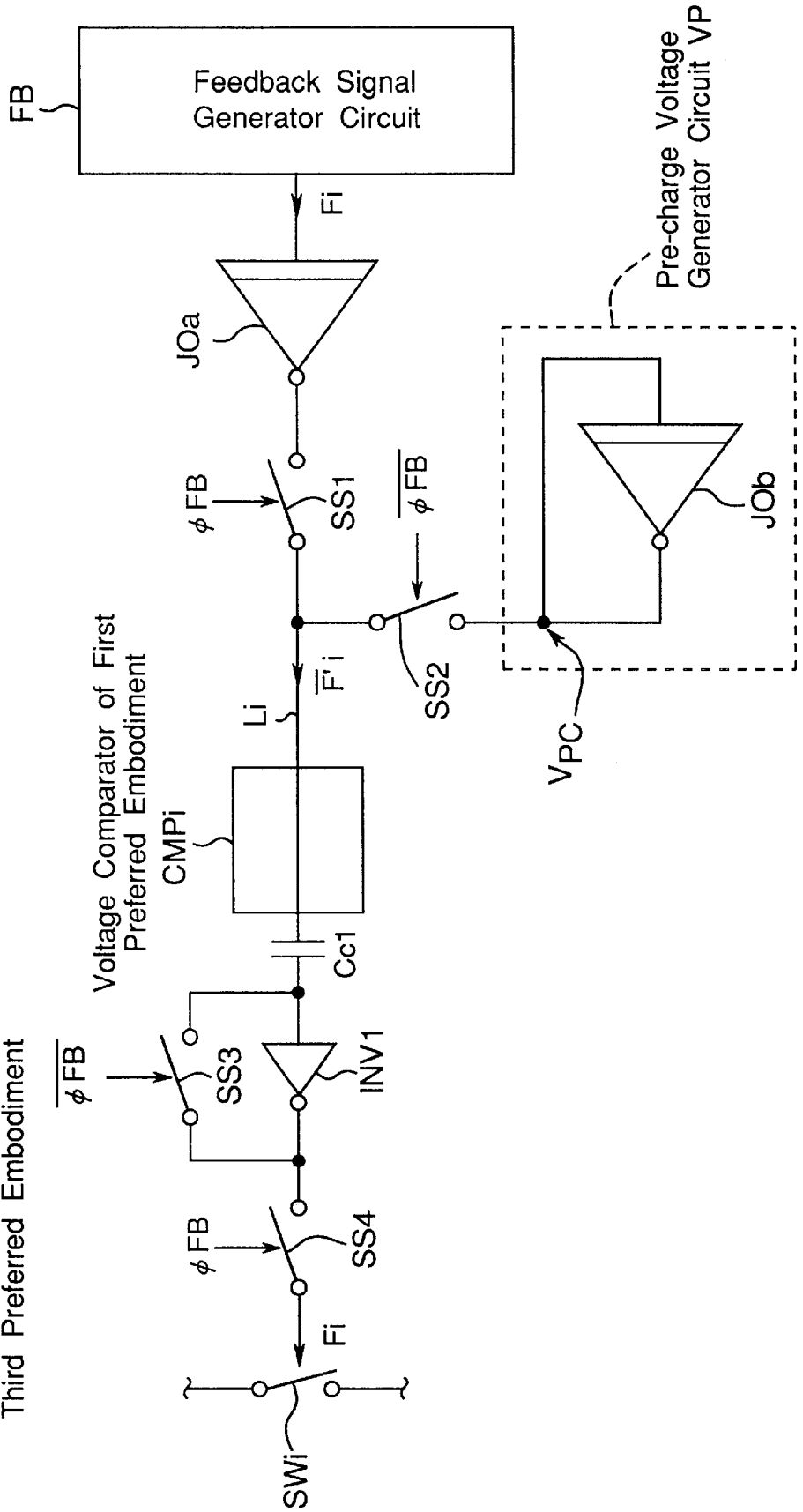
FIG. 3 is a circuit diagram showing a circuit extending from a feedback signal generator circuit to a switch group $SW_i$ in a subranging type A/D converter apparatus of a third preferred embodiment according to the present invention.
Figure 4:
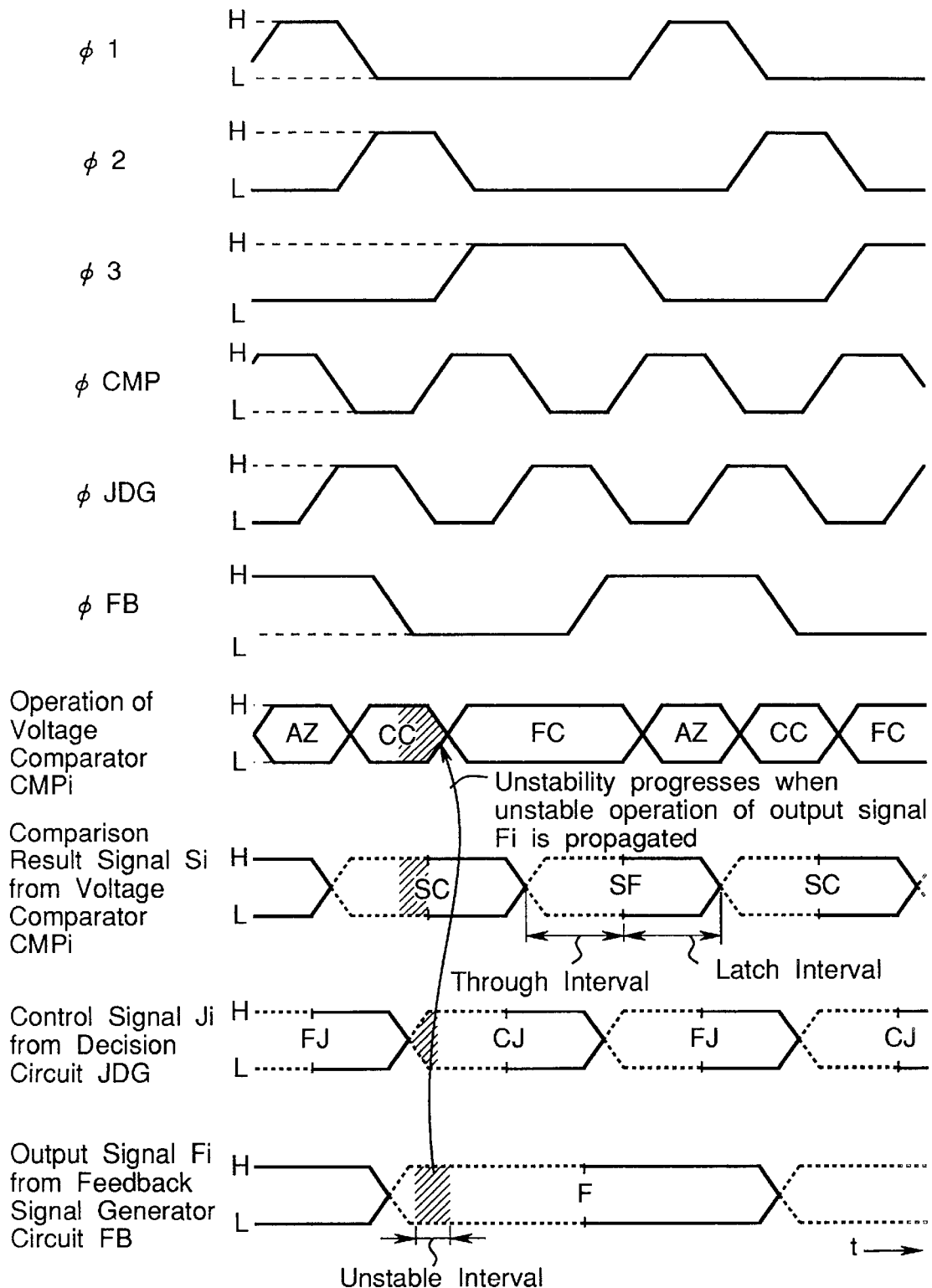
FIG. 4 is a timing chart showing an operation of a subranging type A/D converter apparatus of a prior art and preferred embodiments.
Figure 6:
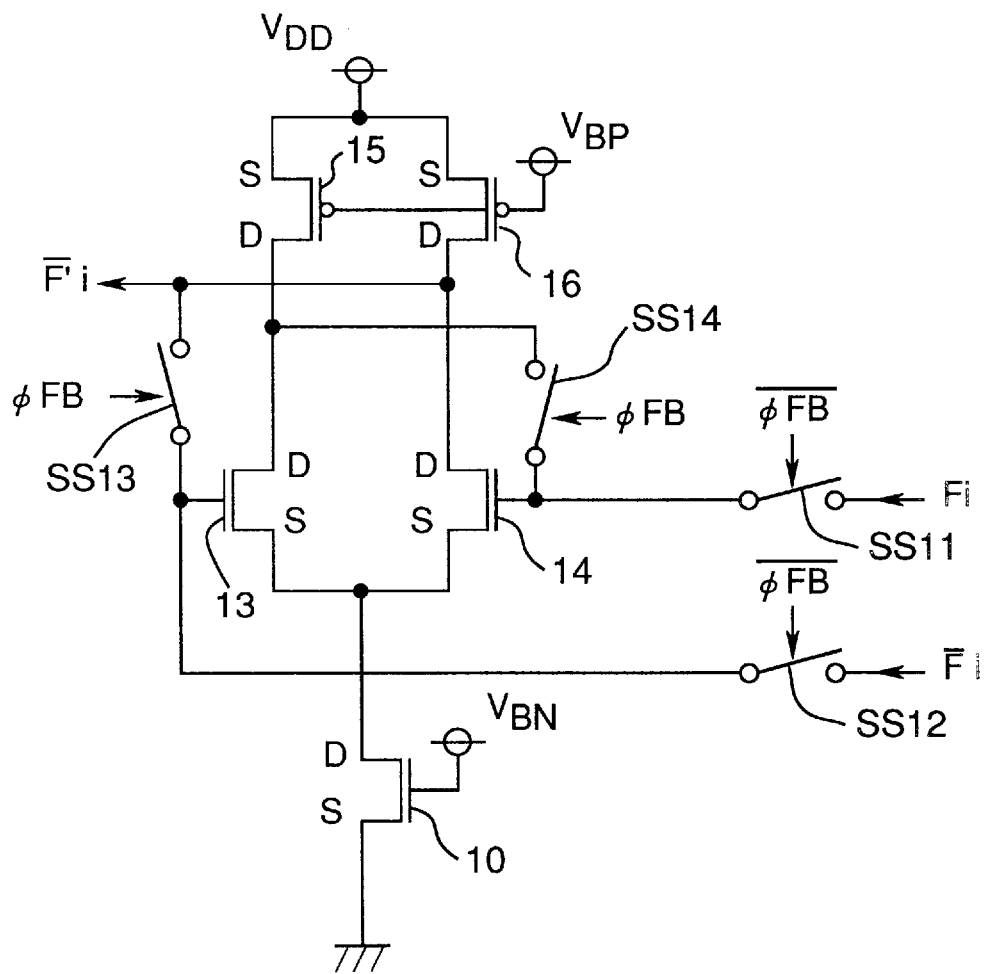
FIG. 6 is a circuit diagram showing a fifth example JO-5 of the modified preferred embodiments of the inverter circuit JO shown in FIGS. 2 and 3.
Figure 7:
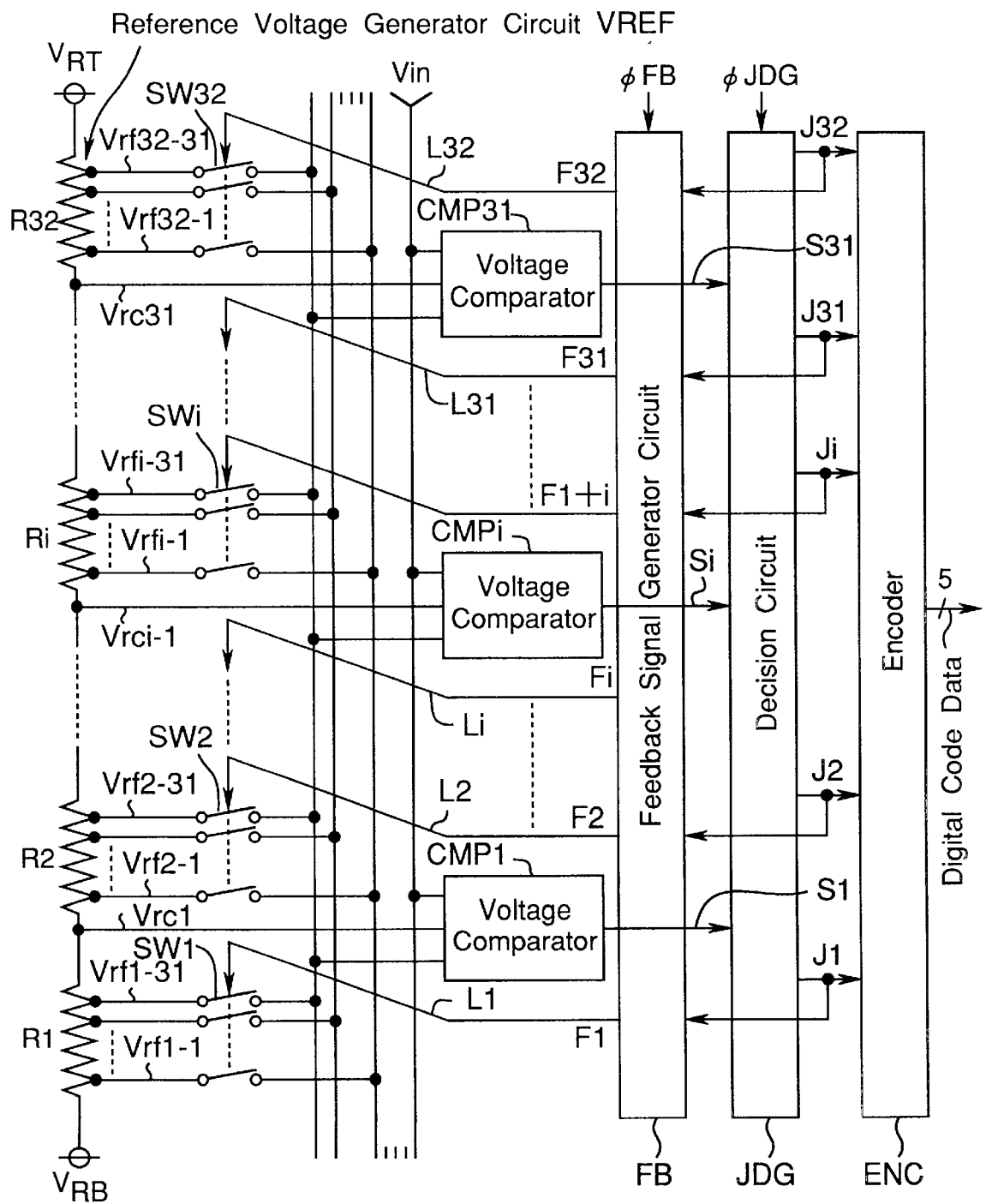
FIG. 7 is a circuit diagram showing the entire construction of a prior art subranging type A/D converter apparatus.
Figure 8:
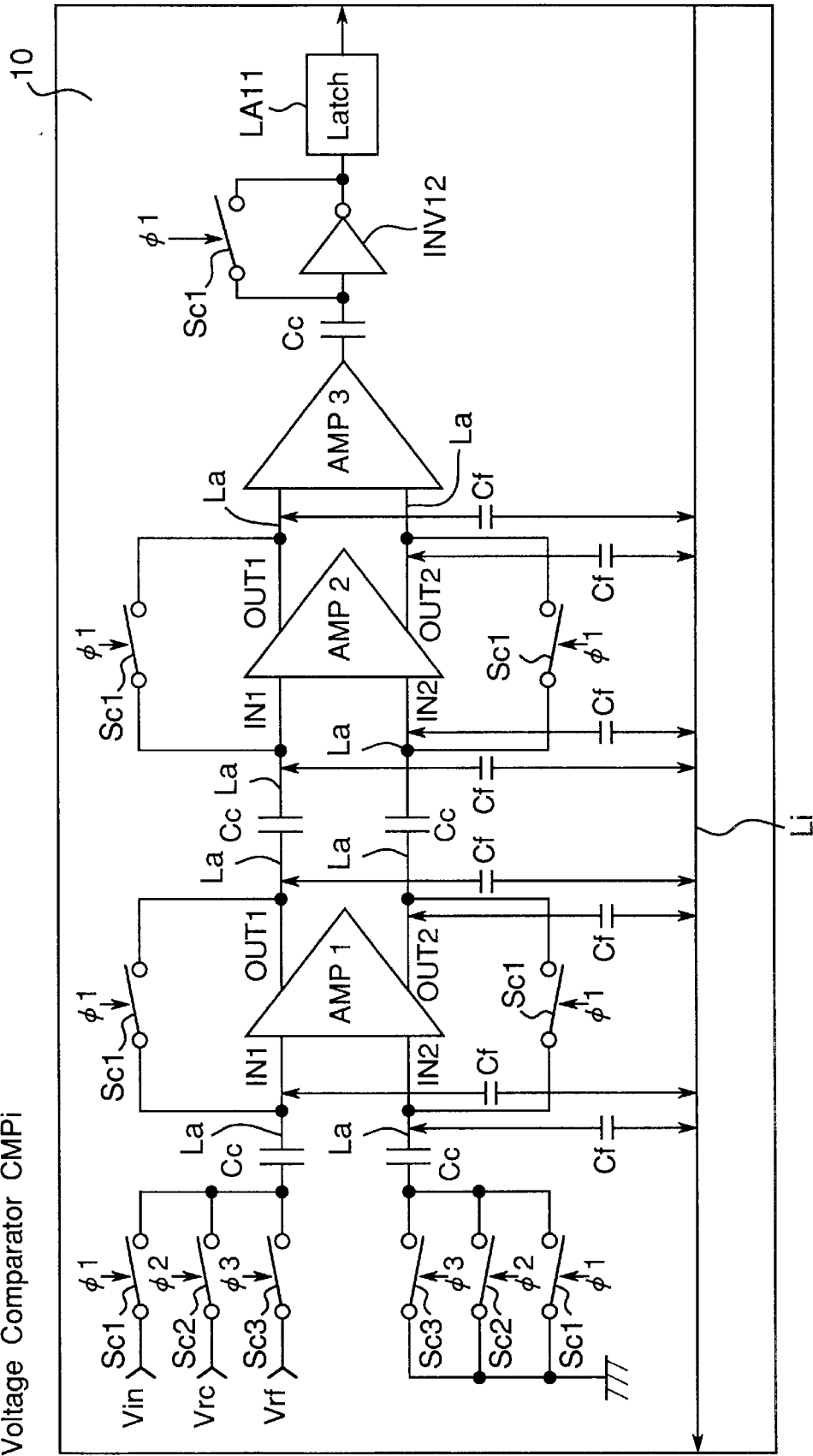
FIG. 8 is a circuit diagram showing a construction of a voltage comparator $CMP_i$ as shown in FIG. 7.

FIG. 3 is a circuit diagram showing a circuit extending from the feedback signal generator circuit FB to the switch group $SW_i$, in a third preferred embodiment of the present invention. The third preferred embodiment is comprised of:

(a) a feedback signal generator circuit FB;

(b) an inverter circuit Joa which is the output circuit of the feedback signal generator circuit FB and is also one of inverter circuits (one of JO-1 through JO-5) of modified preferred embodiments as shown in FIGS. 5A, 5B, 5C and, 5D and FIG. 6, each having a construction different from that of the inverter circuit JO shown in FIG. 2;

(c) a switch group $SW_i$;

(d) a feedback line $L_i$ and a voltage comparator $CMP_i$ each having the features of the first preferred embodiment;

(e) an inverter INV1 inserted for the purpose of (i) coinciding the polarity of the output signal to be applied to the switch group $SW_i$, with that of the output signal $F_i$ outputted from the feedback signal generator circuit FB, and (ii) obtaining a voltage amplitude required for the switching control of the switch group $SW_i$;

(f) a pre-charge voltage generator circuit VP provided with an inverter circuit Job having the same construction as that of the above-mentioned inverter circuit Joa and having its input and output terminals short-circuited to each other;

(g) a coupling capacitor Cc1 which is capacitively coupled with an inverted output signal $\overline{F}_i$ outputted from the feedback line $L_i$ and outputs only an alternating current component of the inverted output signal $\overline{F}_i$; and (h) switches SS1, SS2, SS3 and SS4 which are controlled to be turned on and off in accordance with a timing signal $\phi$FB as shown in the timing chart of FIG. 4.

Referring to FIG. 3, the output signal $F_i$ outputted from the feedback signal generator circuit FB is applied to the feedback line $L_i$ via the inverter circuit Joa, and the switch SS1 controlled by the timing signal $\phi$FB. In the present case, the inverter circuit Joa is, for example, the inverter circuit JO-1 shown in FIG. 5A, and the inverter circuit Joa has an input to output voltage characteristic shown in FIG. 13.

In the inverter circuit JO-1 shown in FIG. 5A, the voltage source $V_{DD}$ is grounded via the followings:

(a) the drain electrode and the source electrode of an NMOS field effect transistor 31 in which its gate electrode and its drain electrode are connected to each other;

(b) the drain electrode and the source electrode of an NMOS field effect transistor 32 in which its gate electrode and its drain electrode are connected to each other;

(c) the source electrode and the drain electrode of a PMOS field effect transistor 33;

(d) the drain electrode and the source electrode of an NMOS field effect transistor 34; and (e) the source electrode and the drain electrode of a PMOS field effect transistor 35 in which its gate electrode and its drain electrode are connected to each other.

The two NMOS field effect transistors 31 and 32 operate as a voltage dropping resistor element RC, while the PMOS field effect transistor 35 operates as a voltage dropping resistor element RD. Each of the PMOS field effect transistor 33 and the NMOS field effect transistor 34 operates as an inverter which has been known to those skilled in the art. In the present case, the positive power source terminal PT of the inverter INV is the source electrode of the PMOS field effect transistor 33, and the negative power source terminal NT of the inverter INV is the source electrode of the NMOS field effect transistor 34. The output signal $F_i$ from the feedback signal generator circuit FB is applied to the gate electrodes of the PMOS field effect transistor 33 and the NMOS field effect transistor 34, while an inverted inverter output signal $\overline{F'}_i$ is outputted from the drain electrodes of the PMOS field effect transistor 33 and the NMOS field effect transistor 34. In the present case, the voltage dropping resistor elements RC and RD drop their voltages by $(\frac{2}{5})V_{DD}$ and $(\frac{1}{5})V_{DD}$, respectively. Therefore, the input to output voltage characteristic of the inverter circuit JO-1 is shown in FIG. 13.

Figure 13:
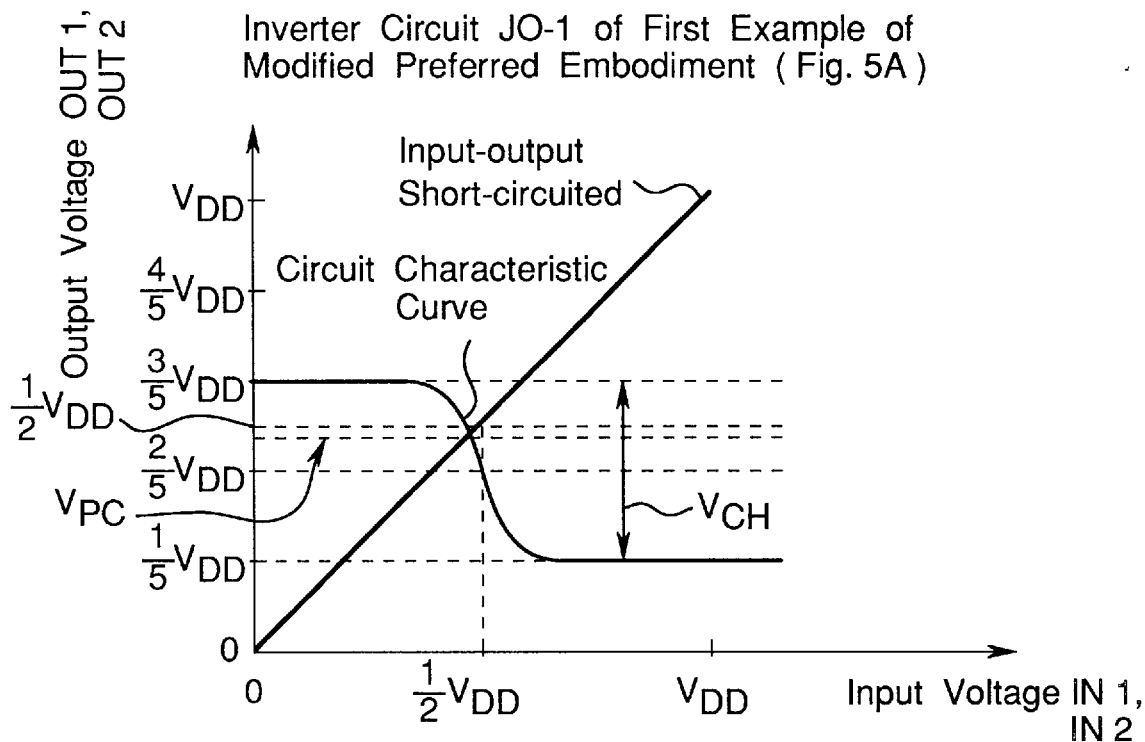
FIG. 13 is a graph showing an input to output voltage characteristic of the inverter circuit JO-1 of the first example shown in FIG. 5A of the modified preferred embodiments.

Referring to FIG. 13, when the input voltage changes from zero to the voltage $V_{DD}$, the output voltage is changed from the voltage $(\frac{3}{5})V_{DD}$ to the voltage $(\frac{1}{5})V_{DD}$, i.e., the inverter circuit JO-1 converts the inputted output signal $F_i$ into the inverted output signal $\overline{F'}_i$ having a full swing voltage amplitude $V_{CH}$ of $(\frac{2}{5})V_{DD}$, and then, outputs the resulting inverted output signal $\overline{F'}_i$. In the present case, the full swing voltage amplitude $V_{CH}$ of the inverter circuit JO-1 is smaller than the full swing voltage amplitude $V_{CH}$ of the inverter circuit JO of the second preferred embodiment, and the center output voltage of the full swing voltage amplitude $V_{CH}$ is slightly deviated or shifted from the voltage $(\frac{1}{2})V_{DD}$ to have a value lower than the voltage $(\overline{1/2})V_{DD}$.

On the other hand, the pre-charge voltage generator circuit VP is provided with an inverter circuit Job having the same construction as that of the above-mentioned inverter circuit Joa and having its input and output terminals short-circuited to each other. The pre-charge voltage generator circuit VP generates a predetermined pre-charge voltage $V_{PC}$, and applies the pre-charge voltage $V_{PC}$ to the feedback line $L_i$ via the switch SS2 controlled by the timing signal $\overline{\phi FB}$, so that the feedback line $L_i$ is previously charged to the pre-charge voltage $V_{PC}$. In this case, the pre-charge voltage $V_{PC}$ becomes a voltage at the intersection of a circuit characteristic curve when the input terminal and the output terminal are opened and a circuit characteristic curve when the input terminal and the output terminal are short-circuited to each other in the input to output voltage characteristic of the inverter circuit JO-1 shown in FIG. 13. In the example shown in FIG. 13, the pre-charge voltage $V_{PC}$ has a value which is close to and lower than the voltage $(\frac{1}{2})V_{DD}$.

The feedback line $L_i$ is formed in the voltage comparator $CMP_i$ in a manner to that of the first preferred embodiment, and the inverted output signal $\overline{F'}_i$ on the feedback line $L_i$ is applied to the switch group $SW_i$ via the coupling capacitor Cc1, an inverter INV11 in which a switch SS3 controlled so as to be switched over in accordance with the timing signal $\overline{\phi FB}$ is connected between its input terminal and its output terminal, and the switch SS4 controlled so as to be switched over in accordance with the timing signal $\phi FB$. In the present case, the switches SS1 and SS4 are turned on when the timing signal $\phi FB$ is at the H level and turned off when the signal is at the L level. On the other hand, the switches SS2 and SS3 are turned on when the timing signal $\overline{\phi FB}$ which is the inverted signal of the timing signal $\phi FB$ is at the L level, and the switches SS2 and SS3 are turned off when the signal $\overline{\phi FB}$ is at the H level.

In the converter apparatus constructed as above, when the timing signal $\phi FB$ is at the L level, the switches SS2 and SS3 are turned on to pull up the feedback line $L_i$ to the pre-charge voltage $V_{PC}$, so that the input terminal and the output terminal of the inverter INV1 are short-circuited to each other so as to fix the voltage at the feedback line $L_i$ approximately to the voltage $(\frac{1}{2})V_{DD}$. Subsequently, when the timing signal $\phi FB$ is made to have the H level, the voltage at the feedback line $L_i$ changes from the pre-charge voltage $V_{PC}$ to a voltage corresponding to the output voltage of the inverter circuit Joa, according to the signal level of the output signal F from the feedback signal generator circuit FB. The resulting changed voltage is propagated as the inverted output signal $\overline{F'}_i$ through the feedback line $L_i$ of the voltage comparator $CMP_i$, and thereafter, the inverted output signal $\overline{F'}_i$ is applied to the inverter INV1 via the coupling capacitor Cc1. At that time, the signal $F_i$ that has been inverted and amplified is outputted from the inverter INV1. When the timing signal $\phi FB$ is made to have the L level, the input terminal and the output terminal of the inverter INV1 are short-circuited to each other, so that the signal level of the signal $F_i$ is fixed and inputted to the control terminal of the switch group $SW_i$ via the switch SS4.

One feature of the present preferred embodiment is that, the inverter circuit Joa, which is the output circuit of the decision circuit JDG, i.e., the output circuit of the feedback signal generator circuit FB, has a circuit construction such that the voltage amplitude of the control signal $F_i$ is smaller than the voltage amplitude of the second preferred embodiment. Further, another feature of the present preferred embodiment is that the pre-charge voltage generator circuit VP, the coupling capacitor Cc1, and the switches SS1 through SS4 are provided for the purpose of matching a voltage level which serves as a reference for discrimination between the H level signal and the L level signal of the inverter circuit Joa that is the output circuit, with a voltage level which serves as a reference for discrimination between the H level signal and the L level signal of the inverter INV1. With the above-mentioned arrangement, the amplitude of the voltage fluctuation (i.e., the full swing voltage amplitude $V_{CH}$) at the feedback line $L_i$ is remarkably reduced in comparison with that of the prior art, and therefore, the influence to be exerted on each of the differential amplifiers AMP1a and AMP2a of the voltage comparator $CMP_i$ can be reduced. By virtue of this advantageous operation, the effect of suppressing the possible deterioration of the operational accuracy of the voltage comparator $CMP_i$ can be improved. Therefore, by reducing the influence of the voltage fluctuation at the feedback line $L_i$ on the input and output signal lines and transistor elements of each of the differential amplifiers AMP1a and AMP2a so as to suppress the possible deterioration of the operational accuracy of each of the differential amplifiers AMP1a and AMP2a, the performance of the A/D conversion accuracy of the subranging type A/D converter apparatus can be remarkably improved.

Modified Preferred Embodiments

FIGS. 5A, 5B, 5C and 5D are circuit diagrams showing modified preferred embodiments of the inverter circuit JO shown in FIGS. 2 and 3, where FIG. 5B is a circuit diagram showing a second example JO-2 of the inverter circuit, FIG. 5C is a circuit diagram showing a third example JO-3 of the inverter circuit and FIG. 5D is a circuit diagram showing a fourth example JO-4 of the inverter circuit. FIG. 6 is a circuit diagram showing a fifth example JO-5 of the modified preferred embodiments of the inverter JO shown in FIGS. 2 and 3. Each of the inverter circuits Joa and Job shown in FIG. 3 may be replaced by any of the inverter circuits JO-2, JO-3, JO-4 and JO-5 of the modified preferred embodiments which will be described in detail below.

In the inverter circuit JO-2 shown in FIG. 5B, a voltage source $V_{DD}$ is grounded via the followings:

(a) the drain electrode and the source electrode of an NMOS field effect transistor 41 in which its gate electrode and its drain electrode are connected to each other;

(b) the source electrode and the drain electrode of a PMOS field effect transistor 42;

(c) the drain electrode and the source electrode of an NMOS field effect transistor 43;

(d) the source electrode and the drain electrode of a PMOS field effect transistor 44 in which its gate electrode and its drain electrode are connected to each other; and (e) the source electrode and the drain electrode of a PMOS field effect transistor 45 in which its gate electrode and its drain electrode are connected to each other.

The NMOS field effect transistor 41 operates as a voltage dropping resistor element RE, and the two PMOS field effect transistors 44 and 45 operate as a voltage dropping resistor element RF. The PMOS field effect transistor 42 and the NMOS field effect transistor 43 operate as an inverter which has been known to those skilled in the art. The output signal $F_i$ from the feedback signal generator circuit FB is applied to the gate electrodes of the PMOS field effect transistor 42 and the NMOS field effect transistor 43, while an inverted inverter output signal $\overline{F'_i}$ is outputted from the drain electrodes of the PMOS field effect transistor 42 and the NMOS field effect transistor 43. In the present case, the voltage dropping resistor elements RE and RF drop their respective voltages by $(\frac{1}{5}) V_{DD}$ and $(\frac{2}{5}) V_{DD}$, respectively. Therefore, in the input to output voltage characteristic of the inverter circuit JO-2 not shown herein, when the input voltage changes from zero to the voltage $V_{DD}$, the output voltage is changed from the voltage $(\frac{1}{5})V_{DD}$ to the voltage $(\frac{2}{5})V_{DD}$, i.e., the inverter circuit JO-2 converts the inputted output signal $F_i$ into the inverted output signal $\overline{F'_i}$ having a full swing voltage amplitude $V_{CH}$ of $(\frac{2}{5})V_{DD}$, and then, outputs the resulting output signal $\overline{F'_i}$. In the present case, the full swing voltage amplitude $V_{CH}$ of the inverter circuit JO-2 is smaller than the full swing voltage amplitude $V_{CH}$ of the inverter circuit JO of the second preferred embodiment, and the center output voltage of the full swing voltage amplitude $V_{CH}$ is slightly deviated or shifted from the voltage $(\frac{1}{2})V_{DD}$ to have a value higher than the voltage $(\frac{1}{2})V_{DD}$.

In the inverter circuit JO-3 shown in FIG. 5C, the voltage source $V_{DD}$ is grounded via the followings:

(a) the drain electrode and the source electrode of an NMOS field effect transistor 51 in which its gate electrode and its drain electrode are connected to each other;

(b) the drain electrode and the source electrode of an NMOS field effect transistor 52 in which its gate electrode and its drain electrode are connected to each other;

(c) the drain electrode and the source electrode of an NMOS field effect transistor 53 in which its gate electrode and its drain electrode are connected to each other;

(d) the source electrode and the drain electrode of a PMOS field effect transistor 54; and (e) the drain electrode and the source electrode of an NMOS field effect transistor 55.

The three NMOS field effect transistors 51, 52 and 53 operate as a voltage dropping resistor element RG, while the PMOS field effect transistors 54 and the NMOS field effect transistor 55 operate as an inverter which has been known to those skilled in the art. The output signal $F_i$ from the feedback signal generator circuit FB is applied to the gate electrodes of the PMOS field effect transistor 54 and the NMOS field effect transistor 55, while an inverted inverter output signal $\overline{F'_i}$ is outputted from the drain electrodes of the PMOS field effect transistor 54 and the NMOS field effect transistor 55. In the present case, the voltage dropping resistor element RG drops the voltage by $(\frac{3}{5})V_{DD}$. Therefore, in the input to output voltage characteristic of the inverter circuit JO-3 not shown herein, when the input voltage changes from zero to the voltage $V_{DD}$, the output voltage is changed from the voltage $(\frac{2}{5})V_{DD}$ to zero, i.e., the inverter circuit JO-3 converts the inputted output signal $F_i$ into the inverted output signal $\overline{F'_i}$ having a full swing voltage amplitude $V_{CH}$ of $(\frac{2}{5})V_{DD}$, and then, outputs the resulting output signal $\overline{F'_i}$. In the present case, the full swing voltage amplitude $V_{CH}$ of the inverter circuit JO-3 is smaller than the full swing voltage amplitude $V_{CH}$ of the inverter circuit JO of the second preferred embodiment, and the center output voltage of the full swing voltage amplitude $V_{CH}$ is deviated or shifted from the voltage $(\frac{1}{2})V_{DD}$ to have a value lower than the voltage $(\frac{1}{2})V_{DD}$.

In the inverter circuit JO-4 shown in FIG. 5D, the voltage source $V_{DD}$ is grounded via the followings:

(a) the source electrode and the drain electrode of a PMOS field effect transistor 61;

(b) the drain electrode and the source electrode of an NMOS field effect transistor 62;

(c) the drain electrode and the source electrode of a PMOS field effect transistor 63 in which its gate electrode and its drain electrode are connected to each other;

(d) the drain electrode and the source electrode of a PMOS field effect transistor 64 in which its gate electrode and its drain electrode are connected to each other; and (e) the drain electrode and the source electrode of a PMOS field effect transistor 65 in which the gate electrode and the drain electrode are connected to each other.

The three NMOS field effect transistors 63, 64 and 65 operate as a voltage dropping resistor element RH. The PMOS field effect transistors 61 and the NMOS field effect transistor 62 operate as an inverter which has been known to those skilled in the art. The output signal $F_i$ from the feedback signal generator circuit FB is applied to the gate electrodes of the PMOS field effect transistor 61 and the NMOS field effect transistor 62, while an inverted inverter output signal $\overline{F'_i}$ is outputted from the drain electrodes of the PMOS field effect transistor 61 and the NMOS field effect transistor 62. In the present case, the voltage dropping resistor element RH drops the voltage by $(\frac{3}{5})V_{DD}$. Therefore, in the input to output voltage characteristic of the inverter circuit JO-4 not shown herein, when the input voltage changes from zero to the voltage $V_{DD}$, the output voltage is changed from the voltage $V_{DD}$ to $(\frac{3}{5})V_{DD}$, i.e., the inverter circuit JO-4 converts the inputted output signal $F_i$ into the inverted output signal $\overline{F'_i}$ having a full swing voltage amplitude $V_{CH}$ of $(\frac{2}{5})V_{DD}$, and then, outputs the resulting output signal $\overline{F'_i}$. In the present case, the full swing voltage amplitude $V_{CH}$ of the inverter circuit JO-4 is smaller than the full swing voltage amplitude $V_{CH}$ of the inverter circuit JO of the second preferred embodiment, and the center output voltage of the full swing voltage amplitude $V_{CH}$ is deviated or shifted from the voltage $(\frac{1}{2})V_{DD}$ to have a value higher than the voltage $(\frac{1}{2})V_{DD}$.

The inverter circuit JO-5 shown in FIG. 6 is provided with the differential amplifiers AMP1 and AMP2 of the prior art including three NMOS field effect transistors 10, 13 and 14 and two PMOS field effect transistors 15 and 16, and the inverter circuit JO-5 has the following construction different from that of the differential amplifiers AMP1 and AMP2.

Referring to FIG. 6, the output signal $F_i$ from the feedback signal generator circuit FB is applied to the gate electrode of the NMOS field effect transistor 14 via a switch SS11 controlled so as to be switched in accordance with the timing signal $\overline{\phi FB}$, while the inverted output signal $\overline{F'_i}$ of the output signal $F_i$ is applied to the gate electrode of the NMOS field effect transistor 13 via a switch SS12 controlled so as to be switched over in accordance with the timing signal $\overline{\phi FB}$. The gate electrode of the NMOS field effect transistor 13 is connected to the drain electrode of the PMOS field effect transistor 16 via a switch SS13 controlled so as to be switched over in accordance with the timing signal $\phi FB$, while the gate electrode of the NMOS field effect transistor 14 is connected to the drain electrode of the PMOS field effect transistor 15 via a switch SS14 controlled so as to be switched over in accordance with the timing signal $\phi FB$. Then, the inverted output signal $\overline{F'_i}$ which has been converted and inverted by the inverter circuit JO-5 is outputted from the drain electrode of the PMOS field effect transistor 16. The switches SS11 and SS12 are turned on when the timing signal $\overline{\phi FB}$ is at the L level, while the switches SS13 and SS14 are turned on when the timing signal $\phi FB$ is at the H level.

Since the PMOS field effect transistors 15 and 16 are connected to the voltage source $V_{BP}$ in the inverter circuit JO-5 constructed as above, the PMOS field effect transistors 15 and 16 are turned on to produce or generate a descent voltage or drop voltage $V_{dsn}$ of a saturation voltage corresponding to its ON-resistance, between the source and the drain. On the other hand, since the NMOS field effect transistor 10 is connected to a voltage source $V_{BN}$, the NMOS field effect transistor 10 is turned on to produce or generate a descent voltage or drop voltage $V_{dsn}$ of a saturation voltage corresponding to its ON-resistance between the source and the drain. Further, when the NMOS field effect transistor 14 is turned on in response to the output signal $F_i$, a descent voltage or drop voltage $V_{dsn}$ of a saturation voltage corresponding to its ON-resistance is produced or generated between the source and the drain. When the NMOS field effect transistor 14 is turned off, the NMOS field effect transistor 14 keeps its OFF-resistance which is close to or substantially equal to the infinity. On the other hand, when the NMOS field effect transistor 13 is turned on in response to the inverted output signal $\overline{F'_i}$, a descent voltage or drop voltage $V_{dsn}$ of a saturation voltage corresponding to its ON-resistance is produced or generated between the source and the drain. When the NMOS field effect transistor 13 is turned off, the NMOS field effect transistor 13 keeps its OFF-resistance which is close to or substantially equal to the infinity.

Figure 14:
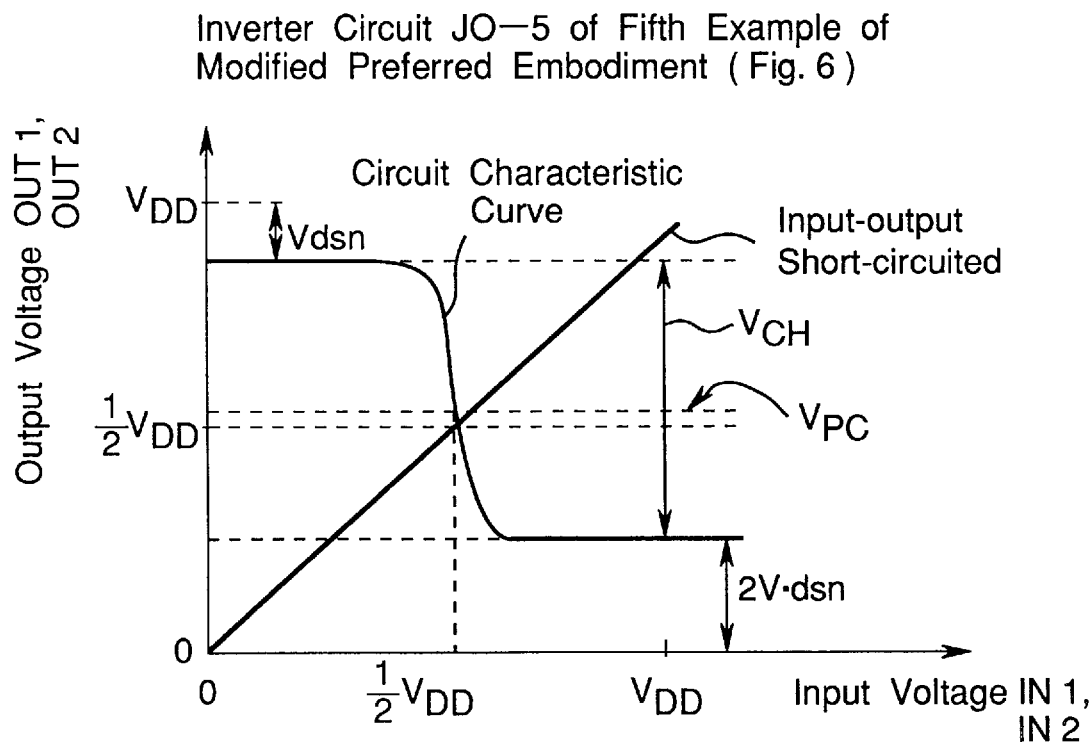
FIG. 14 is a graph showing an input to output voltage characteristic of the inverter circuit JO-5 of the fifth example shown in FIG. 6 of the modified preferred embodiments.

In the inverter circuit JO-5, when the timing signal $\overline{\phi FB}$ is at the H level, the output signal $F_i$ is applied to the gate electrode of the NMOS field effect transistor 14 via the switch SS11, while the inverted output signal $\overline{F'_i}$ is applied to the gate electrode of the NMOS field effect transistor 13 via the switch SS12. When the timing signal $\phi FB$ is made to have the H level, the output signals $F_i$ and $\overline{F_i}$ are latched in latch circuits respectively constituted by the NMOS field effect transistors 13 and 14, and thereafter, the inverted output signal $\overline{F'_i}$ obtained by inverting and converting the output signal $F_i$ is generated and outputted. The input to output voltage characteristic of the inverter circuit JO-5 is shown in FIG. 14. That is, when the input voltage is changed from zero to the voltage $V_{DD}$, the output voltage is changed from the voltage $(V_{DD}-V_{dsn})$ to the voltage $2 \cdot V_{dsn}$. Namely, the inverter circuit JO-5 converts the inputted output signal $F_i$ into the inverted output signal $\overline{F'_i}$ having a full swing voltage amplitude $V_{CH}$ of $(V_{DD}-3 \cdot V_{dsn})$, and then, outputs the resulting output signal $\overline{F'_i}$. In the present case, the full swing voltage amplitude $V_{CH}$ of the inverter circuit JO-5 is smaller than the full swing voltage amplitude $V_{CH}$ of the inverter circuit JO of the second preferred embodiment, and the center output voltage of the full swing voltage amplitude $V_{CH}$ is deviated or shifted from the voltage $(\frac{1}{2})V_{DD}$ to have a value higher than the voltage $(\frac{1}{2})V_{DD}$.

As described above in detail, according to the preferred embodiments of the present invention, there can be provided a subranging type A/D converter apparatus which executes A/D conversion by separating the A/D conversion into an A/D conversion of high-order bits and an A/D conversion of low-order bits in two steps while feeding back the first control signal for executing the A/D conversion of the low-order bits according to the results of A/D conversion of the high-order bits, from a digital logic circuit section for executing the decision of the A/D conversion to the control terminal of the switch group of the reference voltage generator circuit for generating a plurality of reference voltages via the feedback line provided in a plurality of voltage comparators provided with a plurality of differential amplifiers, wherein each of the differential amplifiers is provided with a plurality of transistors for executing differential amplification, and the plurality of transistors are arranged so as to be symmetrical with respect to the feedback line provided in each of the differential amplifiers. With the above arrangement, the influence of a voltage fluctuation on the feedback line for transmitting the control signal for executing the switching control of the switch group on the input and output lines and the transistor elements are reduced, thereby suppressing the possible deterioration of the operational accuracy of each of the differential amplifiers to improve the A/D conversion performance.

Furthermore, in the above-mentioned subranging type A/D converter apparatus, it is preferred that a pair of input signal lines of each of the differential amplifiers are arranged so as to be symmetrical to each other with respect to the feedback line, and a pair of output signal lines of each of the differential amplifiers are arranged so as to be symmetrical to each other with respect to the feedback line. With the above arrangement, the voltage fluctuation at the feedback line exerts its influence equally on the two input signal lines and the MOS field effect transistors of each of the differential amplifiers via the parasitic capacitance Cf between the lines of the prior art shown in FIG. 9. Therefore, an operational balance is assured in the differential amplifiers, so that the error in the output signal is canceled. In other words, the above-mentioned influence of noises and the like can be canceled in the differential amplifiers for comparing the voltage difference between the two inputs, so that the deterioration of the operational accuracy of the voltage comparator can be suppressed.

Furthermore, in the above-mentioned subranging type A/D converter apparatus, it is preferred that the first control signal generated by the digital logic circuit section has a predetermined first voltage amplitude for a full swing of the first control signal, and the subranging type A/D converter apparatus further comprises: a first inverter circuit for converting the control signal generated by the digital logic circuit section into a second control signal having a predetermined second voltage amplitude smaller than the first voltage amplitude for a full swing of the second control signal, inverting the second control signal, and generating and outputting an inverted control signal via the feedback line; and a second inverter circuit for converting the inverted control signal outputted from the first inverter circuit via the feedback line into a third control signal having the first voltage amplitude for a full swing of the third control signal, inverting the third control signal, and generating and outputting a fourth control signal to the control terminal of the switch group of the reference voltage generator circuit. With the above arrangement, the voltage fluctuation at the feedback line exerts its influence equally on the two input signal lines and the MOS field effect transistors of each of the differential amplifiers via the parasitic capacitance Cf between the lines of the prior art shown in FIG. 9. Therefore, an operational balance is assured in the differential amplifiers, so that the error in the output signal is canceled. In other words, the above-mentioned influence of noises and the like can be canceled in the differential amplifiers for comparing the voltage difference between the two inputs, so that the possible deterioration of the operational accuracy of the voltage comparator can be suppressed. Furthermore, the circuit of the converter apparatus can be compacted and reduced in weight.

Furthermore, in the above-mentioned subranging type A/D converter apparatus, it is preferred that the first inverter circuit converts the first control signal generated by the digital logic circuit section into a fifth control signal having a predetermined third voltage amplitude smaller than the second voltage amplitude for a full swing of the fifth control signal, and having a center voltage of the third voltage amplitude different from a center voltage of the first voltage amplitude, inverting the fifth control signal, and generating and outputting an inverted control signal via the feedback line, wherein t h e subranging type A/D converter apparatus comprises: a pre-charge voltage generator circuit for previously charges the feedback line to a predetermined pre-charge voltage close to the center voltage of the full swing of the inverted control signal when a first timing signal is inputted; a coupling capacitor, capacitively coupled with the inverted control signal outputted from the feedback line, for outputting an alternating current component of the inverted control signal to the second inverter circuit; first switch means short-circuiting an input terminal of the second inverter circuit with an output terminal of the second inverter circuit to each other, and keeping the signal level of the inverted control signal inputted to the second inverter circuit when the first timing signal is inputted; second switch means for outputting the inverted control signal outputted from the first inverter circuit to the feedback line when a second timing signal is inputted; and third switch means for outputting the control signal outputted from the second inverter circuit to the control terminal of the switch group of the reference voltage generator circuit when the second timing signal is inputted, and wherein the inverted control signal transmitted via the feedback line has the third voltage amplitude having a center voltage of the pre-charge voltage and changing according to the control signal outputted from the digital logic circuit section. With the above arrangement, the amplitude of the voltage fluctuation at the feedback line (i.e., the full swing voltage amplitude $V_{CH}$) is remarkably reduced in comparison with the prior art, so that the influence on the differential amplifier in the voltage comparator is reduced. By virtue of this advantage, the effect of suppressing the possible deterioration of the operational accuracy of the voltage comparator is improved. Therefore, the influence of the voltage fluctuation at the feedback line on the input and output signal lines and the transistor elements is reduced to suppress the possible deterioration of the operational accuracy of each of the differential amplifiers, so that the A/D conversion accuracy of the subranging type A/D converter apparatus can be remarkably improved.

Furthermore, in the above-mentioned subranging type A/D converter apparatus, it is preferred that the pre-charge voltage generator circuit comprises: a fourth inverter circuit, which is constructed by short-circuiting its input terminal and its output terminal to each other, for generating and outputting the pre-charge voltage; and a fourth switch means for outputting the pre-charge voltage outputted from the fourth inverter circuit to the feedback line when the first timing signal is inputted. With the above arrangement, the influence of the voltage fluctuation at the feedback line on the input and output signal lines and the transistor elements is reduced to suppress the possible deterioration of the operational accuracy of each of the differential amplifiers, so that the A/D conversion accuracy of the subranging type A/D converter apparatus can be remarkably improved. Furthermore, the circuit construction can be simplified to have a compact and light-weight structure.

Furthermore, in the above-mentioned subranging type A/D converter apparatus, it is preferred that the first inverter circuit comprises: an inverter having a positive power source terminal and a negative power source terminal, and provided with an NMOS field effect transistor and a PMOS field effect transistor; a first resistor element, which is connected between the positive power source terminal of the inverter and a voltage source, for dropping a voltage of the voltage source by a predetermined first descent voltage and supplying a resulting dropped voltage to the positive power source terminal of the inverter; and a second resistor element, which is connected between the negative power source terminal of the inverter and the ground, for dropping the voltage at the negative power source terminal of the inverter by a predetermined second descent voltage different from the first descent voltage, to the ground potential. With the above arrangement, the influence of the voltage fluctuation at the feedback line on the input and output signal lines and the transistor elements is reduced to suppress the possible deterioration of the operational accuracy of each of the differential amplifiers, so that the A/D conversion accuracy of the subranging type A/D converter apparatus can be remarkably improved. Furthermore, the circuit construction can be simplified to have a compact and light-weight structure.

Furthermore, in the above-mentioned subranging type A/D converter apparatus, it is preferred that the first inverter circuit comprises: an inverter having a positive power source terminal connected to a voltage source, and a negative power source terminal, and provided with an NMOS field effect transistor and a PMOS field effect transistor; and a second resistor element, which is connected between the negative power source terminal of the inverter and the ground, for dropping the voltage at the negative power source terminal of the inverter by a predetermined second descent voltage which exceeds zero toward the ground potential. With the above arrangement, the influence of the voltage fluctuation at the feedback line on the input and output signal lines and the transistor elements is reduced to suppress the possible deterioration of the operational accuracy of the each of differential amplifiers, so that the A/D conversion accuracy of the subranging type A/D converter apparatus can be remarkably improved. Furthermore, the circuit construction can be simplified to have a compact and light-weight structure.

Furthermore, in the above-mentioned subranging type A/D converter apparatus, it is preferred that the first inverter circuit comprises: an inverter having a positive power source terminal and a grounded negative power source terminal, and provided with an NMOS field effect transistor and a PMOS field effect transistor; and a first resistor element, which is connected between the positive power source terminal of the inverter and a voltage source, for dropping the voltage of the voltage source by a predetermined first descent voltage and supplying a resulting dropped voltage to the positive power source terminal of the inverter. With the above arrangement, the influence of the voltage fluctuation at the feedback line on the input and output signal lines and the transistor elements is reduced to suppress the possible deterioration of the operational accuracy of each of the differential amplifiers, so that the A/D conversion accuracy of the subranging type A/D converter apparatus can be remarkably improved. Furthermore, the circuit construction can be simplified to have a compact and light-weight structure.

Furthermore, in the above-mentioned subranging type A/D converter apparatus, it is preferred that the first inverter circuit comprises a differential amplifier; a pair of first and second NMOS field effect transistors which are constructed so that, upon input of the first timing signal, a voltage between a source and a drain thereof changes within a voltage amplitude smaller than the voltage amplitude of the control signal according to the inputted first control signal; and a pair of switch means, which are connected respectively between the gate electrode of the first MOS field effect transistor and the drain electrode of the second MOS field effect transistor, and between the drain electrode of the first MOS field effect transistor and the gate electrode of the second MOS field effect transistor, for operating upon input of the second timing signal, in response to the first control signal, for making the first and second MOS field effect transistors latch the voltage between the source and the drain of the first MOS field effect transistor, and the voltage between the source and the drain of the second MOS field effect transistor, respectively, and outputting an inverted control signal which is obtained by inverting the first control signal and is made to have a voltage amplitude smaller than the voltage amplitude of the first control signal. With the above arrangement, the influence of the voltage fluctuation at the feedback line on the input and output signal lines and the transistor elements is reduced to suppress the possible deterioration of the operational accuracy of each of the differential amplifiers, so that the A/D conversion accuracy of the subranging type A/D converter apparatus can be remarkably improved. Furthermore, the circuit construction can be simplified to have a compact and light-weight structure.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A subranging type analog-to-digital converter apparatus for executing analog-to-digital conversion by separating the analog-to-digital conversion into an analog-to-digital conversion of high-order bits and an analog-to-digital conversion of low-order bits in two steps, while feeding back a first control signal for executing the analog-to-digital conversion of the low-order bits according to results of the analog-to-digital conversion of the high-order bits, comprising:

a digital logic circuit section for executing decision of the analog-to-digital conversion and sending the decision, via a feedback line provided in conjunction with a plurality of voltage comparators having a plurality of differential amplifiers, to a control terminal of a switch group of a reference voltage generator circuit for generating a plurality of reference voltages, wherein each of said differential amplifiers includes a plurality of transistors each for executing differential amplification, and wherein said plurality of transistors are arranged so as to be symmetrical with respect to said feedback line provided in conjunction with each of said differential amplifiers.

2. The analog-to-digital converter apparatus as claimed in claim 1, wherein a pair of input signal lines of each of said differential amplifiers is arranged so as to be symmetrical to each other with respect to said feedback line, and wherein a pair of output signal lines of each of said differential amplifiers is arranged so as to be symmetrical to each other with respect to said feedback line.

3. The analog-to-digital converter apparatus as claimed in claim 2, wherein the first control signal generated by said digital logic circuit section has a predetermined first voltage amplitude for a full swing of the first control signal, the apparatus further comprising:

a first inverter circuit for converting the first control signal generated by said digital logic circuit section into a second control signal having a predetermined second voltage amplitude smaller than the first voltage amplitude for a full swing of the second control signal, and having a center voltage of the second voltage amplitude different from a center voltage of the first voltage amplitude, inverting the second control signal, and generating and outputting an inverted control signal via said feedback line;

a second inverter circuit for converting the inverted control signal outputted from said first inverter circuit via the feedback line into a third control signal having said first voltage amplitude for a full swing of the third control signal, inverting the third control signal, and generating and outputting a fourth control signal to the control terminal of the switch group of said reference voltage generator circuit;

a pre-charge voltage generator circuit for previously charging said feedback line to a predetermined pre-charge voltage close to a center voltage of signal change of said inverted control signal, in response to a first timing signal;

a coupling capacitor, capacitively coupled with the inverted control signal outputted from said feedback line, for outputting an alternating current component of said inverted control signal to said second inverter circuit;

first switch means for short-circuiting an input terminal of said second inverter circuit with an output terminal of said second inverter circuit to each other, and keep the signal level of the inverted control signal inputted to said second inverter circuit, in response to said first timing signal;

second switch means for outputting the inverted control signal outputted from said first inserter circuit to said feedback line, in response to a second timing signal; and third switch means for outputting the control signal outputted from said second inverter circuit to the control terminal of the switch group of said reference voltage generator circuit, in response to said second timing signal, and wherein said inverted control signal transmitted via said feedback line has said third voltage amplitude having a center voltage of said pre-charge voltage and changing according to the control signal outputted from said digital logic circuit section.

4. The analog-to-digital converter apparatus as claimed in claim 3, wherein said pre-charge voltage generator circuit comprises:

a fourth inverter circuit, having an input terminal and an output terminal short-circuited, for generating and outputting said pre-charge voltage; and fourth switch means for outputting said pre-charge voltage outputted from said fourth inverter circuit to said feedback line, in response to said first timing signal.

5. The analog-to-digital converter apparatus as claimed in claim 3, wherein said first inverter circuit comprises:

an inverter having a positive power source terminal and a negative power source terminal, and comprising a PMOS field effect transistor and an NMOS field effect transistor which are operatively connected between the positive power source terminal and the negative power source terminal;

a first resistor element, operatively connected between the positive power source terminal of said inverter and a voltage source, for dropping a voltage of said voltage source by a predetermined first descent voltage, and supplying a resulting dropped voltage to the positive power source terminal of said inverter; and a second resistor element, operatively connected between the negative power source terminal of said inverter and a ground, for dropping a voltage at the negative power source terminal of said inverter by a predetermined second descent voltage different from said first descent voltage relative, to a ground potential.

6. The analog-to-digital converter apparatus as claimed in claim 3, wherein said first inverter circuit comprises:

an inverter having a positive power source terminal connected to a voltage source, and a negative power source terminal, and comprising a PMOS field effect transistor and an NMOS field effect transistor which are operatively connected between the positive power source terminal and the negative power source terminal; and a first resistor element, operatively connected between the negative power source terminal of said inverter and a ground, for dropping a voltage at the negative power source terminal of said inverter to a ground potential, by a predetermined first descent voltage that exceeds zero.

7. The analog-to-digital converter apparatus as claimed in claim 3, wherein said first inverter circuit comprises:

an inverter having a positive power source terminal and a grounded negative power source terminal, and comprising a PMOS field effect transistor and an NMOS field effect transistor which are operatively connected between the positive power source terminal and the negative power source terminal; and a first resistor element, operatively connected between the positive power source terminal of said inverter and a voltage source, for dropping a voltage of said voltage source by a predetermined first descent voltage, and supplying a resulting dropped voltage to the positive power source terminal of said inverter.

8. The analog-to-digital converter apparatus as claimed in claim 3, wherein said first inverter circuit comprises a differential amplifier; and wherein said differential amplifier comprises:

a pair of first and second NMOS field effect transistors each constructed so that a voltage between a source and a drain thereof changes within a voltage amplitude smaller than a voltage amplitude of said first control signal according to said first control signal, in response to the first timing signal; and a pair of switch means, operatively connected respectively between a gate electrode of said first MOS field effect transistor and a drain electrode of said second MOS field effect transistor and between a drain electrode of said first MOS field effect transistor and a gate electrode of said second MOS field effect transistor, for, in response to the second timing signal, making said first and second MOS field effect transistors latch the voltage between the source and the drain of said first MOS field effect transistor, and the voltage between the source and the drain of said second MOS field effect transistor, respectively, each voltage changing according to said control signal, and outputting an inverted control signal obtained by inverting said first control signal and having a voltage amplitude smaller than the voltage amplitude of said first control signal.

9. The analog-to-digital converter apparatus as claimed in claim 2, wherein the first control signal generated by said digital logic circuit section has a predetermined first voltage amplitude for a full swing of the first control signal, wherein said analog-to-digital converter apparatus further comprises:

a first inverter circuit for converting the first control signal generated by said digital logic circuit section into a second control signal having a predetermined second voltage amplitude smaller than said first voltage amplitude for a full swing of the second control signal, inverting the second control signal, and generating and outputting an inverted control signal via said feedback line; and a second inverter circuit for converting the inverted control signal outputted from said first inverter circuit via the feedback line into a third control signal having said first voltage amplitude for a full swing of the third control signal, inverting the third control signal, and generating and outputting a fourth control signal to the control terminal of the switch group of said reference voltage generator circuit.

10. The analog-to-digital converter apparatus as claimed in claim 1, wherein the first control signal generated by said digital logic circuit section has a predetermined first voltage amplitude for a full swing of the first control signal, wherein said analog-to-digital converter apparatus further comprises:

a first inverter circuit for converting the first control signal generated by said digital logic circuit section into a second control signal having a predetermined second voltage amplitude smaller than said first voltage amplitude for a full swing of the second control signal, inverting the second control signal, and generating and outputting an inverted control signal via said feedback line; and a second inverter circuit for converting the inverted control signal outputted from said first inverter circuit via the feedback line into a third control signal having said first voltage amplitude for a full swing of the third control signal, inverting the third control signal, and generating and outputting a fourth control signal to the control terminal of the switch group of said reference voltage generator circuit.

11. The analog-to-digital converter apparatus as claimed in claim 1, wherein the first control signal generated by said digital logic circuit section has a predetermined first voltage amplitude for a full swing of the first control signal, the apparatus further comprising;

a first inverter circuit for converting the first control signal generated by said digital logic circuit section into a second control signal having a predetermined second voltage amplitude smaller than the first voltage amplitude for a full swing of the second control signal, and having a center voltage of the second voltage amplitude different from a center voltage of said first voltage amplitude, inverting the second control signal, and generating and outputting an inverted control signal via said feedback line;

a second inverter circuit for converting the inverted control signal outputted from said first inverter circuit via the feedback line into a third control signal having said first voltage amplitude for a full swing of the third control signal, inverting the third control signal, and generating and outputting a fourth control signal to the control terminal of the switch group of said reference voltage generator circuit;

a pre-charge voltage generator circuit for previously charging said feedback line to a predetermined pre-charge voltage close to a center voltage of signal change of said inverted control signal, in response to a first timing signal;

a coupling capacitor, capacitively coupled with the inverted control signal outputted from said feedback line, for outputting an alternating current component of said inverted control signal to said second inverter circuit;

first switch means for short-circuiting an input terminal of said second inverter circuit with an output terminal of said second inverter circuit to each other, and keep the signal level of the inverted control signal inputted to said second inverter circuit, in response to said first timing signal;

second switch means for outputting the inverted control signal outputted from said first inverter circuit to said feedback line, in response to a second timing signal; and third switch means for outputting the control signal outputted from said second inverter circuit to the control terminal of the switch group of said reference voltage generator circuit, in response to said second timing signal, and wherein said inverted control signal transmitted via said feedback line has said third voltage amplitude having a center voltage of said pre-charge voltage and changing according to the control signal outputted from said digital logic circuit section.

12. The analog-to-digital converter apparatus as claimed in claim 11, wherein said pre-charge voltage generator circuit comprises:

a third inverter circuit, having an input terminal and an output terminal short-circuited, for generating and outputting said pre-charge voltage; and fourth switch means for outputting said pre-charge voltage outputted from said third inverter circuit to said feedback line, in response to said first timing signal.

13. The analog-to-digital converter apparatus as claimed in claim 11, wherein said first inverter circuit comprises:

an inverter having a positive power source terminal and a negative power source terminal, and comprising a PMOS field effect transistor and an NMOS field effect transistor which are operatively connected between the positive power source terminal and the negative power source terminal;

a first resistor element, operatively connected between the positive power source terminal of said inverter and a voltage source, for dropping a voltage of said voltage source by a predetermined first descent voltage, and supplying a resulting dropped voltage to the positive power source terminal of said inverter; and a second resistor element, operatively connected between the negative power source terminal of said inverter and a ground, for dropping a voltage at the negative power source terminal of said inverter by a predetermined second descent voltage different from said first descent voltage relative, to a ground potential.

14. The analog-to-digital converter apparatus as claimed in claim 11, wherein said first inverter circuit comprises:

an inverter having a positive power source terminal connected to a voltage source, and a negative power source, and a negative power source terminal, and comprising a PMOS field effect transistor and an NMOS field effect transistor which are operatively connected between the positive power source terminal and the negative power source terminal; and a first resistor element, operatively connected between the negative power source terminal of said inverter and a ground, for dropping a voltage at the negative power source terminal of said inverter to a ground potential, by a predetermined first descent voltage that exceeds zero.

15. The analog-to-digital converter apparatus as claimed in claim 11, wherein said first inverter circuit comprises:

an inverter having a positive power source terminal and a grounded negative power source terminal, and comprising a PMOS field effect transistor and an NMOS field effect transistor which are operatively connected between the positive power source terminal and the negative power source terminal; and a first resistor element, operatively connected between the positive power source terminal of said inverter and a voltage source, for dropping a voltage of said voltage source by a predetermined first descent voltage, and supplying a resulting dropped voltage to the positive power source terminal of said inverter.

16. The analog-to-digital converter apparatus as claimed in claim 11, wherein said first inverter circuit comprises a differential amplifier; and wherein said differential amplifier comprises:

a pair of first and second NMOS field effect transistors each constructed so that a voltage between a source and a drain thereof changes within a voltage amplitude smaller than a voltage amplitude of said first control signal according to said first control signal, in response to the first timing signal; and a pair of switch means, operatively connected respectively between a gate electrode of said first MOS field effect transistor and a drain electrode of said second MOS field effect transistor and between a drain electrode of said first MOS field effect transistor and a gate electrode of said second MOS field effect transistor, for, in response to the second timing signal, making said first and second MOS field effect transistors latch the voltage between the source and the drain of said first MOS field effect transistor, and the voltage between the source and the drain of said second MOS field effect transistor, respectively, each voltage changing according to said control signal, and outputting an inverted control signal obtained by inverting said first control signal and having a voltage amplitude smaller than the voltage amplitude of said first control signal.

17. An analog-to-digital converter apparatus, comprising:

a reference voltage generator for generating a plurality of first reference voltages and a plurality of second reference voltages, each of the second reference voltages being a voltage between a first voltage of the first reference voltage and a second voltage of the first reference voltages lower than said first voltage;

a plurality of voltage comparators inputting an analog signal, each of said voltage comparators comparing a voltage of the analog signal with one of the first reference voltages, outputting a first comparison result, while comparing the voltage of the analog signal with one of the second reference voltages, and outputting a second comparison result;

a judgement circuit for judging first and second comparison results outputted from said plurality of comparators and outputting a digital signal of high-order bits and a digital signal of low-order bits, respectively; and a feedback line for transmitting a feedback signal to said reference voltage generator in response to one bit of said digital signal of high-order bits, said reference voltage generator generating said plurality of second reference voltages in accordance with said feedback signal;

wherein one of said plurality of comparators has at least one differential amplifier performing a differential amplifying operation for first and second input signals, said differential amplifier including first and second transistors, control electrodes of said first and second transistor receiving said first and second input signals, respectively, wherein said first and second transistors are arranged on opposite sides with respect to said feedback line.

18. The analog-to-digital converter apparatus as claimed in claim 17, wherein said differential amplifier further includes:

a third transistor having a first electrode connected with a first electrode of said first transistor at a first output node, a second electrode connected with a first voltage source and a control electrode connected with a second voltage source;

said third transistor outputting a first output signal from said first output node;

a fourth transistor having a first electrode connected with a first electrode of said second transistor at a second output node, a second electrode connected with said first voltage source and a control electrode connected with said second voltage source;

said fourth transistor outputting a second output signal from said second output node;

wherein, with respect to said feedback line, said third and fourth transistors are arranged on opposite sides to each other and on the same sides as said first and second transistors, respectively.

19. The analog-to-digital converter apparatus as claimed in claim 18, wherein said differential amplifier further includes:

a fifth transistor having a first electrodes connected with a second electrode of said first transistor, a second electrode connected with a third voltage source and a control electrode connected with a fourth voltage source; and a sixth transistor having a first electrode connected with a second electrode of said second transistor, said second electrode being connected with said third voltage source and a control electrode connected with said fourth voltage source;

wherein said fifth and sixth transistors are arranged on opposite sides with respect to said feedback line, and on the same side as said first and second transistors with respect to said feedback line.

20. The analog-to-digital converter apparatus as claimed in claim 17, further comprising;

an inverter having an input terminal connected with said judgment circuit and an output terminal connected with said feedback line, a voltage amplitude for a full swing of a signal outputted from said output terminal being smaller than a voltage amplitude for a full swing of a signal applied to said input terminal in response to one bit of said digital signal of high-order bits.

21. The analog-to-digital converter apparatus as claimed in claim 17, wherein said first and second transistors are symmetrically arranged with respect to said feedback line.

* * * * *

UNITED STATES PATENT AND TRADEMARK OFFICE
CERTIFICATE OF CORRECTION

PATENT NO. : 5,812,079
DATED : September 22, 1998
INVENTOR(S) : Masao ITO, et al.

It is certified that error appears in the above-identified patent and that said Letters Patent is hereby corrected as shown below:

Claim 1, line 11, delete "in conjunction"

Signed and Sealed this

Fourth Day of May, 1999

Attest:

Q. TODD DICKINSON

*Attesting Officer*    *Acting Commissioner of Patents and Trademarks*